United States Patent [19]
Adan et al.

[11] Patent Number: 5,841,170
[45] Date of Patent: Nov. 24, 1998

[54] FIELD EFFECT TRANSISTOR AND CMOS ELEMENT HAVING DOPANT EXPONENTIALLY GRADED IN CHANNEL

[75] Inventors: Alberto Oscar Adan, Ikoma; Seiji Kaneko, Nara, both of Japan

[73] Assignee: Sharp Kabushiki Kaisha, Osaka, Japan

[21] Appl. No.: 782,251

[22] Filed: Jan. 14, 1997

[30] Foreign Application Priority Data

Apr. 25, 1996 [JP] Japan ................................. 8-105915

[51] Int. Cl.$^6$ .................... H01L 27/12; H01L 27/105; H01L 29/786
[52] U.S. Cl. ................... 257/345; 257/69; 257/350; 257/351; 257/335; 257/338; 257/336; 257/655
[58] Field of Search .................. 257/347, 350, 257/351, 335–339, 345, 69, 655

[56] References Cited

U.S. PATENT DOCUMENTS

| | | | |
|---|---|---|---|
| 5,449,937 | 9/1995 | Arimura | 257/345 |
| 5,477,073 | 12/1995 | Wakai et al. | 257/347 |
| 5,567,966 | 10/1996 | Hwang | 257/347 |

FOREIGN PATENT DOCUMENTS

| | | |
|---|---|---|
| A-0487220 | 5/1992 | European Pat. Off. . |
| 0497216 A2 | 8/1992 | European Pat. Off. . |
| 3-175458 | 9/1985 | Japan . |
| 5-21800 | 1/1993 | Japan . |
| A-05021800 | 1/1993 | Japan . |
| 5-218425 | 8/1993 | Japan . |
| 6-268215 | 9/1994 | Japan . |
| A-06268215 | 9/1994 | Japan . |

OTHER PUBLICATIONS

Y. Okumura, et al., "Source–to–Drain Nonuniformly Doped Channel (NUDC) MOSFET Structures for High Current Drivability and Threshold Voltage Controllability," IEEE Trans ED, vol. 39, No. 11, Nov. 1992, pp. 2541–2552.

Apr. 1995 Symposium on VLSI Technology Digest of Technical Papers, Terauchi et al pp. 35 & 36; Supression of the Floating–Body Effects in SOI MOSFETs by Bandgap Engineering.

"Reduction of Kink Effect in Thin–film SOI MOSFETS", IEEE Electron Device Letters, Feb. 1998, USA, vol. 9, NR. 2, pp. 97–99, ISSN 0741–3106 XP002056395.

Primary Examiner—Olik Chaudhuri
Assistant Examiner—John F. Guay
Attorney, Agent, or Firm—Nixon & Vanderhye P.C.

[57] ABSTRACT

A field effect transistor is fabricated on an SOI substrate. N-type source and drain regions are arranged apart from each other in a semiconductor thin film of the SOI substrate. A P-type channel region is formed between the source and drain regions. Moreover, a gate electrode is formed over the channel region to cover the channel region through a gate oxide film. Extreme portions of the channel region, adjacent to the source and drain regions, have higher doping concentrations than in a center portion thereof. Furthermore, the gradient of the doping profile in the channel region is adjusted so as to reduce the current gain of a parasitic transistor in the field effect transistor. This structure enables a reduction of the channel length of the field effect transistor to the sub-half-micron order without deteriorating the electrical characteristics of the field effect transistor.

25 Claims, 22 Drawing Sheets

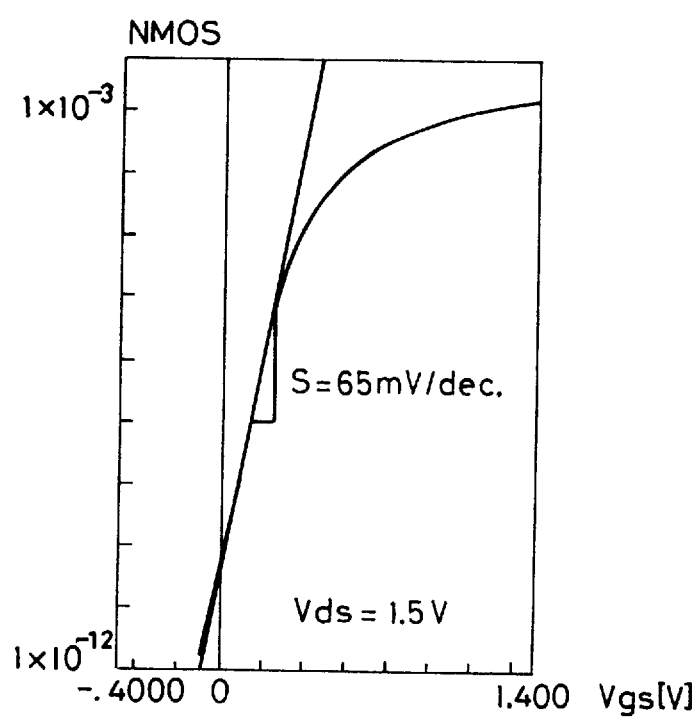
F I G. 13

FIELD EFFECT TRANSISTOR AND CMOS ELEMENT HAVING DOPANT EXPONENTIALLY GRADED IN CHANNEL

FIELD OF THE INVENTION

The present invention relates to a field effect transistor (FET) and a CMOS element using the field effect transistor, and more particularly to a field effect transistor and CMOS element which are capable of shortening the channel length to the sub-micron order and suitable for use in integrated circuits.

BACKGROUND OF THE INVENTION

MOSFETs (Metal Oxide Semiconductor FETs) fabricated on SOI (Silicon On Insulator) substrates like SOS (Silicon On Sapphire), SIMOX (Silicon Separation by ion IMplantation of OXygen) and BSOI (Bonded SOI) offer advantages in low-voltage and high-speed operation, and have been widely used. Additionally, the SOI-MOSFETs result in smaller layout area compared to MOSFETs fabricated on bulk silicon, thereby relatively easily increasing the degree of integration. In recent years, particularly, in order to meet an increasing demand for high-performance portable equipment such as a portable communication system, it is expected that the SOI-MOSFETs offering the above-mentioned advantages will further spread. The following description will briefly explain the general structures of the MOSFET and SOI-MOSFET on bulk silicon.

FIG. 25 illustrates an MOSFET (hereinafter just referred to as the "FE") 51 fabricated on a bulk silicon substrate 52. The FET 51 is constructed by $N^{30}$ source region 53 and drain region 54 disposed with a space therebetween on a surface of the bulk silicon substrate 52, a P-type channel region 55 formed between the regions 53 and 54, and a gate electrode 56 electrically insulated from the channel region 55 by, for example, an oxide film.

As shown in FIG. 26, an equivalent circuit of the FET 51 is formed by a field effect transistor T1$a$, a parasitic bipolar transistor T2$a$ (hereinafter just referred to as the "parasitic transistor"), a current source $I_i$ for generating an impact ionization current and so on. The impact ionization current flows to a substrate terminal B through a base resister $R_B$. Therefore, in order to drive the FET 51, four terminals, namely, gate terminal G, source terminal S, drain terminal D and substrate terminal B, are required.

In the above-mentioned structure of FET 51, the base terminal of the parasitic transistor T2$a$ is connected to the substrate terminal B. Since the substrate-source junction is reverse biased when the FET 51 is operated, the parasitic transistor T2$a$ has substantially no influence on the operation of the FET 51.

FIG. 27 illustrates an SOI-MOSFET 61 fabricated on an SOI substrate 62. The SOI substrate 62 includes a semiconductor thin film layer 62$c$ formed, for example, on a silicon substrate 62$a$ with an insulating film 62$b$ therebetween. Unlike the regions 53, 54 and 55 shown in FIG. 25, a source region 63, a drain region 64, and a channel region 65 of the FET 61 are formed in the semiconductor thin film layer 62$c$. A gate electrode 66 has the same structure as the gate electrode 56.

As shown in FIG. 28, an equivalent circuit of the SOI-MOSFET (hereinafter just referred to as the "FET") 61 is formed by a field effect transistor T1$b$, a parasitic transistor T2$b$, a current source I$i$, and so on like the FET 51. The FET 61 is distinguished from the FET 51 by that the base of the parasitic transistor T2$b$ is connected to the substrate terminal B through $C_{box}$. Accordingly, the FET 61 operates only with three terminals, gate, source and drain. In this case, the substrate terminal B of the FET 61 could be grounded, but the body of the FET 61 is floating.

In the FET 61, in normal operation, impact ionization current generated at the drain junction could act as a base current for a parasitic transistor T2$b$, creating a positive feedback current and degrading electrical characteristics of the FET 61, especially short-channel effects and reduction of the source-drain breakdown voltage. Such a degradation of the electrical characteristics imposes a serious limitation for device integration.

In order to solve the problem, various measures have been taken. The following description will briefly discuss first to seventh conventional examples.

As the first conventional example, a FET 61$a$ including an LDD (Lightly Doped Drain) structure is shown in FIG. 29. Source and drain regions 63 and 64 of the FET 61$a$ include LDD regions 71 implanted at low doping dose with N⁻impurities in the vicinity of a channel region 65. In this structure, a depletion layer readily spreads between the drain region 64 and the channel region 65. As a result, the electric field becomes moderate, and the breakdown voltage of the FET 61$a$ increases.

The second example is an FET using a buried Ge, disclosed by M. Terauchi et al. "Suppression of the Floating-Body Effect in SOI MOSFETs by Bandgap Engineering", 1995 Symp. on VLSI Technology, pp. 35–36, Kyoto, Japan, June 1995. Silicon bandgap engineering is applied to this FET, and energy Eg at the source-body junction is reduced by the implantation of Ge. As a result, the current gain of the parasitic transistor of the FET is reduced.

The third conventional example is an FET 61$c$ including a barrier region 73 made of material like $SiO_2$ between the source and drain regions 63 and 64 as shown in FIG. 30. For instance, this concept is disclosed in the Japanese Publication for Unexamined Patent Application No. 175458/1985 (Tokukaisho 60-175458). By forming the barrier region 73, the short-channel effects are suppressed in the FET 61$c$.

The fourth conventional example is a FET 61$d$ as an SOI-MOSFET using a "pocket" implant, described in European Patent No. 0 497 216 A2. As illustrated in FIG. 31, in the FET 61$d$, source and drain regions 63$d$ and 64$d$ on the surface of the SIO substrate 62 extend to a channel region 65$d$, forming extensions 74. Formed underneath the extensions 74 are "pocket" implant regions 75 of the same conductivity type as the body. The effect of the "pocket" implant is to increase the body doping level at the interface with the oxide film 62$b$ in the channel region 65$d$. As a result, in the channel region 65$d$, the back interface threshold voltage is enhanced, and the back channel current is reduced.

The fifth conventional example is an FET 61$e$ including a common drain region just below the gate electrode 66, described in Japanese Publication for Unexamined Patent Application No. 218425/1993 (Tokukaihei 5-218425). As illustrated in FIG. 32, a semiconductor thin film layer 62$c$ of the FET 61$e$ includes an N-type common drain region 81 underneath the gate electrode 66, and source and drain regions 83 and 84 disposed on both sides of the common drain region 81 through channel regions 82, respectively. The common drain region 81 is kept at a floating electrical potential, and collects holes generated at the drain region 84, thereby suppressing the action of the parasitic transistor T2$b$.

The sixth conventional example is an FET 61$f$ including an intrinsic semiconductor region just below the gate electrode 66, described in Japanese Publication for Unexamined Patent Application No. 21800/1993 (Tokukaihei 5-21800). As illustrated in FIG. 33, a semiconductor thin film layer 62c of the FET 61f includes an intrinsic semiconductor region 91 underneath the gate electrode 66. In the semiconductor thin film layer 62c, N$^+$ source and drain regions 93 and 94 are formed on both sides of the region 91 through P$^-$ channel regions 92, respectively. The intrinsic semiconductor region 91 usually has a low doping level ranging from $10^{10}/cm^3$ to $10^{12}/cm^3$, and increases the carrier mobility. Moreover, the threshold voltage of the FET 61f is set depending on the channel regions 92. It is thus possible to control the threshold voltage while permitting high-speed operations.

The seventh conventional example (Japanese Publication for Unexamined Patent Application No. 268215/1994 (Tokukaihei 6-268215) discloses an FET 61g including the channel region 65, high-doping regions 77 at the edges of the channel region 65, and a low doping region 78 formed in a portion of the channel region 65 other than the edges as shown in FIG. 34. The regions 77 have a doping level so that the regions 77 are not fully depleted when forming an inversion layer. The region 78 has an extremely low doping level.

Similarly to the sixth conventional example, since the low doping region 78 has a low doping level, the carrier mobility is enhanced. Additionally, since the high doping regions 77 have a high doping level, the regions 77 are not fully depleted when forming the inversion layer. Therefore, even if the thickness of the semiconductor thin film 62c varies, the variation of the threshold voltage can be reduced.

However, the above-mentioned FET structures described as means for solving the conventional problems have limitations in reducing the size of the FET into the sub-half-micron dimensions because these structures cause the degradation of electrical characteristics and a complicated element structure.

More specifically, the LDD region 71 of the FET 61a shown in FIG. 29 increases not only the source-drain breakdown voltage but also the source-drain parasitic resistance. As a result, a problem arises when driving the FET 61a at low voltage.

In the second and third conventional examples as means for solving the conventional problems, it is necessary to implant germanium and form the barrier region 73 shown in FIG. 30. Therefore, the fabrication process becomes complicated, and shortening of the channel length is limited.

Moreover, the FET 61d shown in FIG. 31 requires a body contact to minimize the floating body effect, resulting in an increase in the layout area of the element. Furthermore, the "pocket" implant regions 75 must be concentrated underneath the source/drain extensions 74. Thus, it is difficult to form the "pocket" implant regions 75 in a very thin SOI substrate 61. Accordingly, it is difficult to apply this pocket implantation technique to the fabrication of highly integrated FETs such as sub-half-micron FETs. From the operational point of view, the "pocket" implant regions 75 only prevent back channel conduction by enhancing the back channel threshold voltage. However, since the surface structure of the semiconductor thin film layer 62c is the same as that of the FET 61 shown in FIG. 27, the parasitic transistor T2b affects the operation of the FET 61d like the FET 61.

In the FET 61e shown in FIG. 32, since the channel length d of the channel regions 82 cannot be made shorter than a certain value, it is difficult to improve the degree of integration. For example, when the gate length is 0.35 $\mu$m, the channel length d must be about 0.1 $\mu$m. However, this length is very much comparable to the lateral diffusion of N$^+$ impurities implanted to form the source and drain regions 83 and 84. Therefore, the control of implanting impurities is extremely difficult. When the channel length d is about 0.1 $\mu$m, the depletion layer from the drain region 84 will punch through the channel region 82. Hence, the characteristics of the FET 61e are very difficult to control. In summary, the structure of the FET 61e is not practical for sub-half-micron device application.

The structure of the FET 61f presented in FIG. 33 requires the intrinsic semiconductor region 91, and P-channel regions 92 on both sides thereof. As in the case of the FET 61e, it would be very difficult to control the length of the channel regions 92 in this structure. Furthermore, with a very low doping of the intrinsic semiconductor region 91, the current gain of the parasitic transistor T2b is enhanced, resulting in a lowering of the punchthrough breakdown voltage in the FET 61f.

The structure of the FET 61g reported in FIG. 34 is essentially the same as that of the FET 61f, and has similar limitations. Additionally, the high doping regions 77 are not fully depleted. Therefore, the "kink" effect is exhibited in the output Id-Vds characteristics.

SUMMARY OF THE INVENTION

It is an object of the present invention to provide a field effect transistor and a CMOS element capable of being driven at low voltage and high speed and of improving the degree of integration to a sub-half-micron order.

In order to achieve the above object, a field effect transistor of the present invention includes:

a channel region of a first conductivity type formed in a superficial semiconductor layer overlying an electrically insulating substrate;

a source region and a drain region of a second conductivity type different from the first conductivity type, the source and drain regions being disposed with the channel region therebetween;

a highly doped portion provided in the channel region at least in a section adjacent to the source region, the highly doped portion having a doping profile formed so that a concentration of impurities of the first conductivity type is monotonically lowered toward a center portion of the channel region; and a gate electrode insulated from the channel region by an electrically insulating layer.

The doping profile is adjusted by controlling the implantation energy, dose, and angle between the implantation direction and the superficial semiconductor layer, for example, when ion-implanting impurities of the first conductivity type, or controlling the annealing time and temperature when activating the implanted impurities.

In this structure, by adjusting the doping profile of the impurities of the first conductivity type in the channel region of the field effect transistor that can be driven at high speed and low voltage and is formed on an electrically insulating substrate capable of easily improving the degree of integration, i.e., an SOI MOSFET, the current gain $h_{fe}$ of a bipolar transistor parasitic on the field effect transistor (hereinafter referred to as the "parasitic transistor") can be reduced without deteriorating the characteristics of the field effect transistor such as the source-drain parasitic resistance. It is thus possible to achieve high-speed, highly-integrated field effect transistor capable of being driven at low voltage.

Namely, since the current gain $h_{fe}$ is reduced, it is possible to suppress the short-channel effect. Therefore, even when the channel length is shortened, it is possible to restrain a lowering of the breakdown voltage compared to a conventional structure. Moreover, even when the channel length is shortened, a lowering of the roll-off characteristics of the threshold voltage is restrained. Consequently, the field effect transistor can be driven at lower voltage compared to the conventional structure.

Furthermore, since the above-mentioned structure is the same as the conventional structure except for the doping profile in the channel region, special members and processing steps are not further required. In particular, when adjusting the profile by annealing and ion implantation, it is possible to manufacture the field effect transistor through the same fabrication process as a conventional fabrication process. Consequently, the fabrication process is simplified compared to a conventional example requiring other members and processing steps.

Moreover, since a desired doping profile is graded, even if the impurities are diffused in annealing performed after implanting the impurities into the channel region, the diffusion can be used for adjusting the doping profile into the desired profile. It is thus possible to reduce the influence of the diffusion of the impurities on the shortening of the channel length. As a result, the size of the field effect transistor is reduced, and the degree of integration is improved.

In addition to the above-mentioned structure, it is preferred that the doping profile in the channel region is arranged so that the channel region is fully depleted when forming an inversion layer. This arrangement prevents the "kink" effect from being exhibited in the drain current characteristics versus the source-drain voltage.

When the doping profile is given by an approximate value $N(x)$ $$N(x) = N_0 + N_{B0} \cdot \exp[-(\eta \cdot x)^g]$$

where $N_0$ is a minimum doping level, $N_{B0}$ is a maximum doping level, x is a displacement ($\mu$m) from the highly doped portion toward the center portion of the channel region, g is a doping profile sharpness, and $\eta(\mu m^{-1})$ is a doping profile gradient coefficient, $\eta$ is preferably between 8 $\mu m^{-1}$ and 20 $\mu m^{-1}$.

With this structure, it is certain that the current gain $h_{fe}$ of the parasitic transistor is approximately minimized with a sharpness, g, for example, ranging from about 1 to 10 within which the desired profile is easily formed. As a result, the electrical characteristics of the field effect transistor such as the drive voltage and operation speed are further improved.

In general, when the doping profile is adjusted by performing ion-implantation of, for example, boron as impurities and annealing, the doping profile can be easily made into a gaussian profile. When forming the gaussian doping profile in the above-mentioned manner, it is preferred that the gradient of the doping level of the first conductivity type from the highly doped portion toward the center portion of the channel region is arranged between $3 \times 10^{22}/cm^4$ to $8 \times 10^{22}/cm^4$. With this arrangement, it is possible to substantially minimize the current gain $h_{fe}$ of the parasitic transistor with accuracy. As a result, the electrical characteristics of the field effect transistor can be further improved.

There are some methods for forming the desired doping profile in the channel region. Examples include controlling the ion-implantation conditions when implanting impurities into the channel region, and controlling the drive-in annealing conditions. The ion-implantation conditions are, for example, the implantation energy, dose, and the tilted angle between the implantation direction and the surface of the electrically insulating substrate. The drive-in annealing conditions are, for example, the annealing time and temperature. However, when adjusting the profile by controlling only the drive-in annealing conditions without particularly controlling the ion-implantation conditions, i.e., when the ion implantation is performed substantially perpendicularly to the surface of the electrically insulating substrate and then the profile is adjusted only by the diffusion of the impurities performed by annealing, higher annealing temperature and longer annealing time or a delicate adjustment of the annealing temperature are required compared to the adjustment of the profile performed by controlling both of these conditions.

It is therefore preferred to adjust the doping profile by controlling both of the ion-implantation and drive-in annealing conditions. In this case, the restrictions on the ion-implantation and drive-in annealing conditions are relatively relaxed, and the tilted angle of ion-implantation or the annealing time and temperature can be freely set. Consequently, it is possible to avoid high-temperature annealing which deteriorate the quality of the field effect transistor. As a result, the quality of the field effect transistor is further improved.

Moreover, the ion-implantation and drive-in annealing are essential for implanting impurities into the channel region and activating the impurities, and therefore more widely performed than before. Thus, even when the doping profile is adjusted by controlling the ion-implantation conditions and drive-in annealing conditions, the number of processing steps in fabricating the field effect transistor is restrained to the same level as that in fabrication in which an attempt to improve the quality of the field effect transistor is not made, thereby simplifying the fabrication process of the field effect transistor.

The highly doped portion may be provided only in a portion of the channel region, adjacent to the source region. However, it is more preferred to provide the highly doped portion in both of portions of the channel region, adjacent to the source region and drain region. When the highly doped portion is formed only in one portion adjacent to the source region, an additional step of producing the other portion using a mask like a photoresist is required in the process of doping impurities so as to prevent the impurities from entering into the other portion. On the other hand, when the highly doped portion is formed on both of the portions adjacent to the source region and drain region, such an additional process is not required. It is thus possible to further simplify the fabrication process of the field effect transistor.

In a preferred structure, the source region or drain region adjacent to the highly doped portion includes a first region adjacent to the highly doped portion, and a second region having a higher doping concentration of impurities of the second conductivity type than in the first region. In this structure, the depletion layer readily spreads between the drain region and the channel region. It is therefore possible to moderate the electric field and further increase the breakdown voltage of the field effect transistor.

Since the above-mentioned structures offer advantages like a lowering of the threshold voltage and an improvement of the degree of integration, the field effect transistors with such structures can be suitably used in various electronic circuits. For instance, a particularly suitable application is a CMOS element which is often used for the purpose of reducing the power consumption. When the above-mentioned field effect transistor is used as P-type and N-type field effect transistors constituting a CMOS element, it is possible to achieve a high-speed, low-power-consuming, compact CMOS element. Consequently, a high-performance, high-speed, low-power-consuming electronic circuit is realized.

For a fuller understanding of the nature and advantages of the invention, reference should be made to the ensuing detailed description taken in conjunction with the accompanying drawings.

BRIEF DESCRIPTION OF THE DRAWINGS

FIG. 13 is a graph showing sub-threshold characteristics in the NMOSFET.

DESCRIPTION OF THE PREFERRED EMBODIMENTS

The following description will discuss one embodiment of the present invention with reference to FIGS. 1 to 21.

Figure 1:
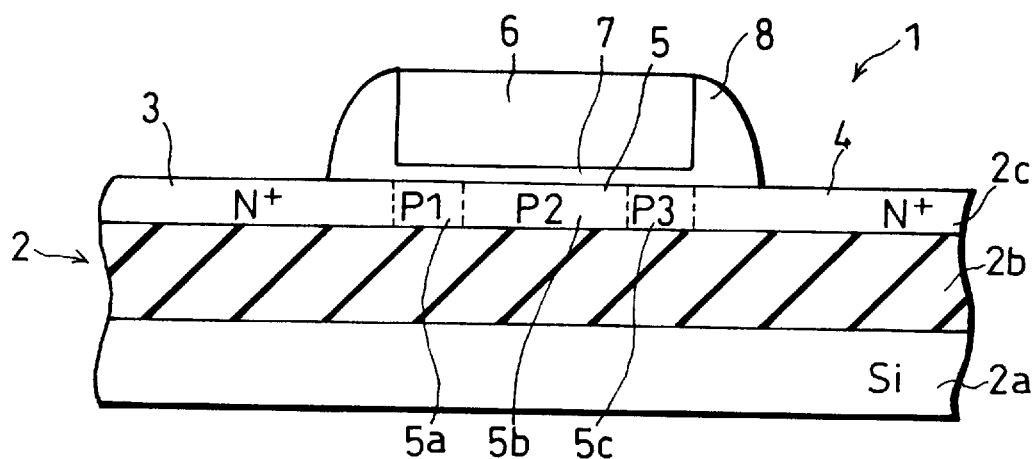
FIG. 1 is a cross sectional view showing essential sections of an NMOSFET fabricated on an SOI substrate according to one embodiment of the present invention.

As illustrated in FIG. 1, a field effect transistor (hereinafter just referred to as the "FET") 1 of this embodiment is formed on an SOI (Silicon On Insulator) substrate 2 such as SOS (Silicon On Sapphire), SIMOX (Silicon Separation by ion IMplantation of OXygen) and BSOI (Bonded SOI). For example, the FET 1 is formed by layering a semiconductor thin film 2c made of material like silicon on a substrate 2a made of a material such as silicon, sapphire, rock crystal and glass through an insulating film 2b made of an insulating material, for example, $SiO_2$. In FIG. 1, for instance, the substrate 2a is formed by silicon. The thickness, $T_{box}$, of the insulating film 2b is normally between 50 nm and 500 nm. The semiconductor thin film 2c has a source region 3, a drain region 4, and a channel region 5, forming an active transistor. The thickness of the semiconductor thin film 2c is set to a desired value depending on the final characteristics of the FET 1.

The source region 3 and the drain region 4 are separated from each other by the channel region 5. The source and drain regions 3 and 4 are highly doped to reduce the source-drain resistance. In this embodiment, an NMOSFET is explained as an example of the FET 1, and the source and drain regions 3 and 4 of $N^+$ type are formed by implanting, for example, arsenic.

Figure 2:
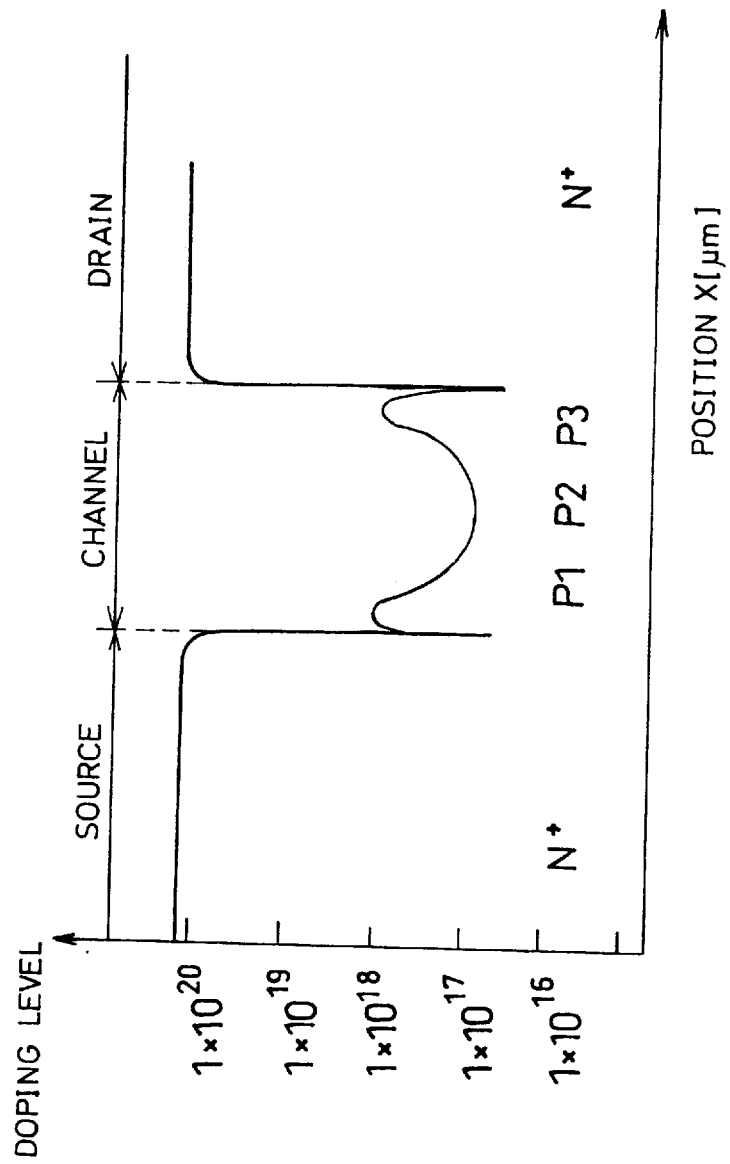
FIG. 2 is a graph showing an example of a doping profile in the NMOSFET.

In this embodiment, the channel region 5 between the regions 3 and 4 is divided into three regions of different doping levels, namely, 5a, 5b and 5c. The three regions 5a, 5b and 5c are of the same conductivity type. For instance, in the case of NMOSFET, the regions 5a, 5b and 5c are made P type by implanting boron or indium. As shown in FIG. 2, the extreme region 5a adjacent to the source region 3 and the extreme region 5c adjacent to the drain region 4 have a higher doping level than the center region 5b.

Unlike the structure disclosed by the Japanese Publication for Unexamined Patent Application No. 268215/1994 above, the doping levels in the extreme regions 5a and 5c of the channel region 5 are set so that the extreme regions 5a and 5c are fully depleted when forming an inversion layer. Moreover, the profile of the doping level (hereinafter just referred to as the "doping profile") in the channel region 5 is taken into consideration in this embodiment.

Figure 3:
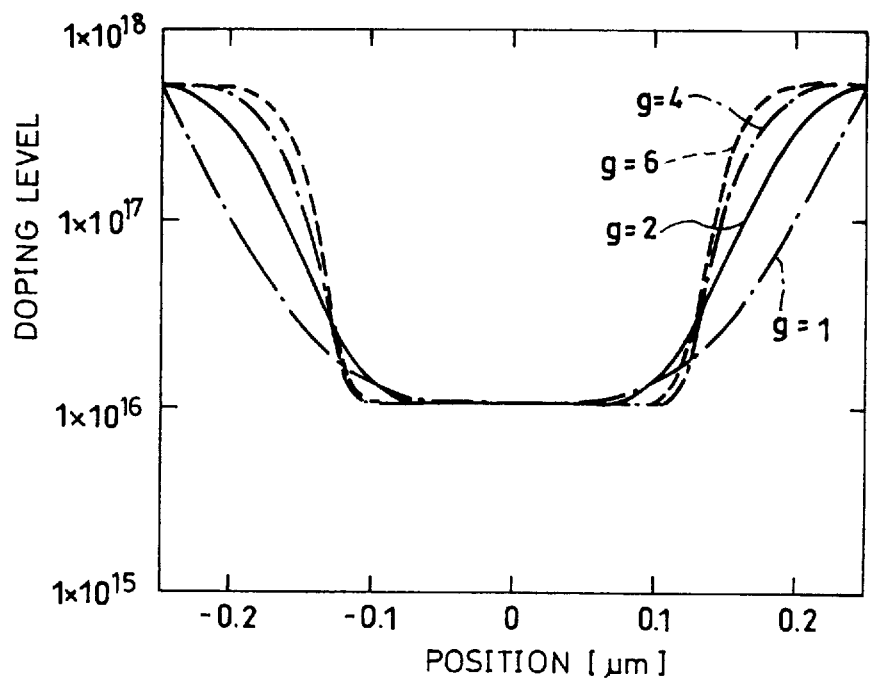
FIG. 3 is a graph showing examples of the doping profile of P-type impurities in a channel region when the sharpness, g, is changed in the NMOSFET.

Here, the doping profile in the channel region 5 is discussed in detail. The doping profile of P-type impurities in the channel region 5 is arranged so that the doping level is substantially monotonically lowered from the extreme regions 5a and 5c toward the center region 5b as shown in FIG. 3.

More specifically, the doping profile of impurities in the channel region 5 is given by an approximate value $N(x)$ $$N(x) = N_0 + N_{B0} \cdot \{\exp(-[\eta \cdot (x-L/2)]^g) + \exp(-[\eta \cdot (x+L/2)]^g)\} \quad (1)$$

where x is a distance ($\mu$m) measured from the center of the channel region 5(x=0), and L is the channel length ($\mu$m). It should be noted that the center position of the channel region 5 is indicated as x=0. In this embodiment, since the doping profile in the channel region 5 slopes on both sides, $N(x)$ is expressed by the sum of the exp term representing the slope on the source side and the exp term indicating the slope on the drain side.

When looking at the slope on one side irrespectively of whether the doping profile N slopes on one side or both sides, equation (1) above is rewritten as $$N(x') = N_0 + N_{B0} \cdot \{\exp[-(\eta \cdot x')^g]\} \quad (1)'$$

where x' is a displacement ($\mu$m) from the source region 3 or drain region 4 adjacent to the slope toward the center of the channel region 5. Thus, the doping profile can be expressed by one exp term. In the following description, unless otherwise specified, both equations (1) and (1)' are referred to as the doping profile $N(x)$ and equation (1) without making distinction.

In equation (1), $N_0$ represents the minimum doping level, i.e., the doping level at the center of the channel region 5. $N_{B0}$ represents the maximum doping level, i.e., the doping level at the junction of the channel region 5 and the source region 3 and/or drain region 4. In the case of the channel region 5 of this embodiment, for instance, the doping level is set so that $N_0$ is around $1 \times 10^{16}$ and $N_{B0}$ is around $5.1 \times 10^{17}$.

Figure 4:
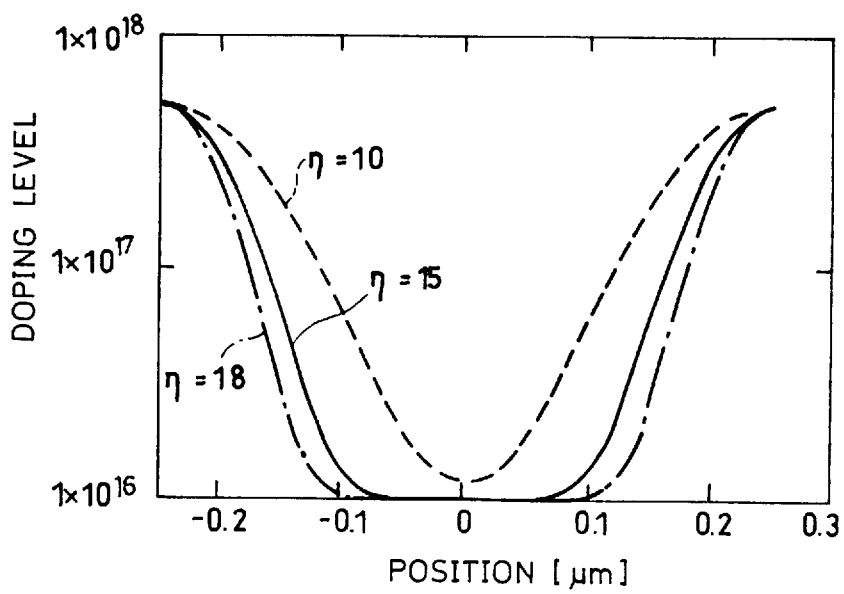
FIG. 4 is a graph showing examples of the doping profile of P-type impurities in the channel region when the gradient coefficient, $\eta(\mu m^{-1})$; is changed in the NMOSFET.

In equation (1), $\eta$ and g are coefficients indicating the sharpness and gradient of the doping profile. The gradient coefficient and the sharpness of change are hereinafter referred to as $\eta$ and g, respectively. As shown in FIG. 3, when g=1, the doping profile $N(x)$ changes into an exponential profile. When g=2, the doping profile $N(x)$ changes into a gaussian profile. The doping profile in the channel region 5 becomes more abrupt as g increases. On the other hand, as shown in FIG. 4, even when the sharpness, g, is constant (g=2), the gradient of the doping profile in the channel region 5 becomes moderate as the gradient coefficient $\eta(\mu m^{-1})$ decreases. Hence, FIG. 4 shows profiles for different gradient coefficients, $\eta=10$, $\eta=15$ and $\eta=18$, when the channel length L is 0.5 $\mu$m.

As to be discussed below, the doping profile in the channel region 5 is determined based, for example, on the energy level and the angle in implanting impurities, and the annealing time in activating the impurities.

As illustrated in FIG. 1, the channel region 5 having such a doping profile is completely covered with the gate electrode 6, and is controlled by the gate electrode 6. The gate electrode 6 is made of refractory metal such as $MoSi_2$ and $WSi_2$, or a polysilicon layer. A gate oxide film 7 made of material like $SiO_2$ is disposed between the gate electrode 6 and the channel region 5 so as to electrically insulate the channel region 5 from the gate electrode 6. Moreover, a gate side wall spacer 8 is formed by an electrically insulating material such as $SiO_2$ on a side of the gate electrode 6.

Figure 5:
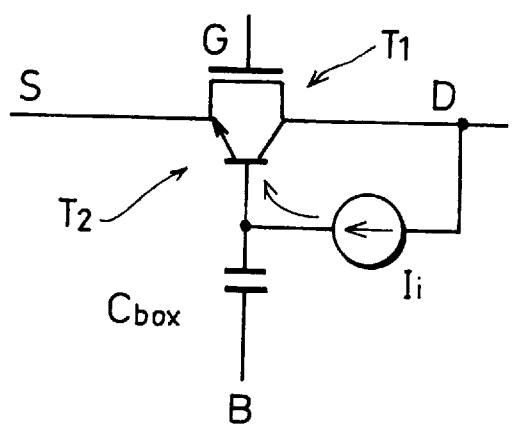
FIG. 5 is a circuit diagram of an equivalent circuit of the NMOSFET.

The following description will discuss the electrical characteristics of the FET 1 of this embodiment. As illustrated in FIG. 5, an equivalent circuit of the FET 1 fabricated on the SOI substrate 2 like a conventional circuit includes an NPN parasitic bipolar transistor (hereinafter referred to as the "parasitic transistor") T2 and a current source $I_i$ for generating an impact ionization current at the drain junction as well as an ideal FET (hereinafter referred to as the "field effect transistor") T1 of NMOS type. In the field effect transistor T1 and the parasitic transistor T2, the drain and collector, and the source and emitter are connected to each other. Moreover, the base of the parasitic transistor T2 is connected to the drain through the current source $I_i$. As a result, the impact ionization current flows through the base of the parasitic transistor T2, creating a positive feedback current. The base of the parasitic transistor T2 is coupled to the substrate 2a through a capacitance $C_{box}$ when $C_{box}$ represents the equivalent capacitance of the buried insulator layer 2b.

Therefore, the source-drain breakdown voltage BVds is affected and varied by the current gain $h_{fe}$ of the parasitic transistor T2. The source-drain breakdown voltage BVd is expressed as $$BVds = BVcb/(h_{fe})^{(1/n)} \quad (2)$$

where BVcb is the collector-base (drain-channel) breakdown voltage and n is a parameter that depends on the junction profile and doping levels. However, n is substantially constant at around 4.

In addition, the current gain $h_{fe}$ is determined by the carrier transit time and an approximate value can be derived as $$1/h_{fe} = (\tau_F/\tau_n) + (\mu_p/\mu_n) \cdot (n_{ie}/n_i)^2 \cdot (NB/Nds) \quad (3)$$

$$= (\tau_F/\tau_n) + (\mu_p/\mu_n) \cdot (NB/Nds) \cdot \exp(\Delta Eg/kT)$$

where $\tau_F$ and $\tau_n$ are the carriers transit time and lifetime in the base (channel) region, respectively, $\mu_p/\mu_n$ is the hole and electron mobility ratio, NB is the Gummel number in the base region, Nds is the Gummel number in the emitter (source region), and $\Delta Eg$ is the energy gap reduction of silicon due to high doping. NB and Nds are determined by the doping profile in each region, and increase as the doping level in the corresponding region becomes higher.

As shown by equation (3), the current gain $h_{fe}$ of the parasitic transistor T2 is affected and varied by the doping level and the doping profile in the channel region 5. More specifically, in equation (3), as the doping level in the channel region 5 increases, NB becomes greater and the lifetime $\tau_n$ of minority carriers becomes shorter. As a result, the current gain $h_{fe}$ of the parasitic transistor T2 decreases.

In this embodiment, the doping profile in the channel region 5 is determined based on the sharpness g and gradient coefficient $\eta(\mu m^{-1})$ as shown by equation (1) above. Accordingly, the current gain $h_{fe}$ of the parasitic transistor T2 can be expressed as a function of the coefficients g and $\eta$.

Figure 6:
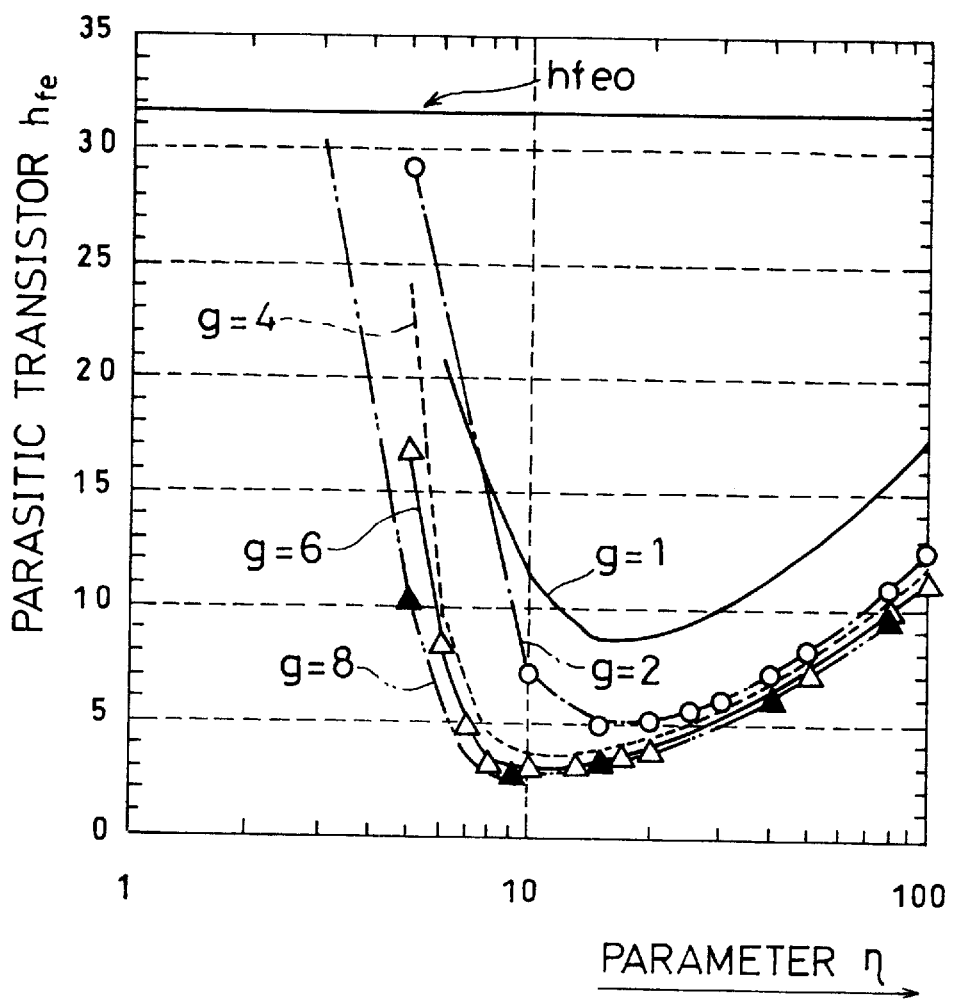
FIG. 6 is a graph showing the current gain of a parasitic transistor versus the gradient coefficient, $\eta(\mu m^{-1})$ when the sharpness, g, is changed in the NMOSFET.

As illustrated in FIG. 6, for example, when the doping profile in the channel region 5 is an exponential profile (g=1), the current gain $h_{fe}$ is minimized with a gradient coefficient $\eta$ of approximately 16 to 18. When the doping profile is a gaussian profile (g=2), the current gain $h_{fe}$ is minimized to approximately 5 with a gradient coefficient $\eta(\mu m^{-1})$ of around 15. When g=4, 6 or 8, the current gain $h_{fe}$ is minimized with a gradient coefficient $\eta$ of approximately 8 to 15. In any of these cases, the current gain $h_{fe}$ is minimized when the gradient coefficient $\eta$ is between 8 and 20. Additionally, when g=2, the optimum doping level gradient is approximately between $3\times10^{22}/cm^4$ and $8\times 10^{22}/cm^4$.

Compared to the conventional current gain $h_{fe0}$ when the doping profile in the channel region 5 is uniform, the FET 1 of this embodiment can reduce the current gain $h_{fe}$ of the parasitic transistor T2 to approximately 1/10 by setting the coefficients g and $\eta$ to optimum values. It is thus possible to provide the FET 1 in which the current gain $h_{fe}$ of the parasitic transistor T2 is about 3 to 8. Consequently, the electrical characteristics of the FET 1 are significantly improved compared to the conventional structure.

Figure 7:
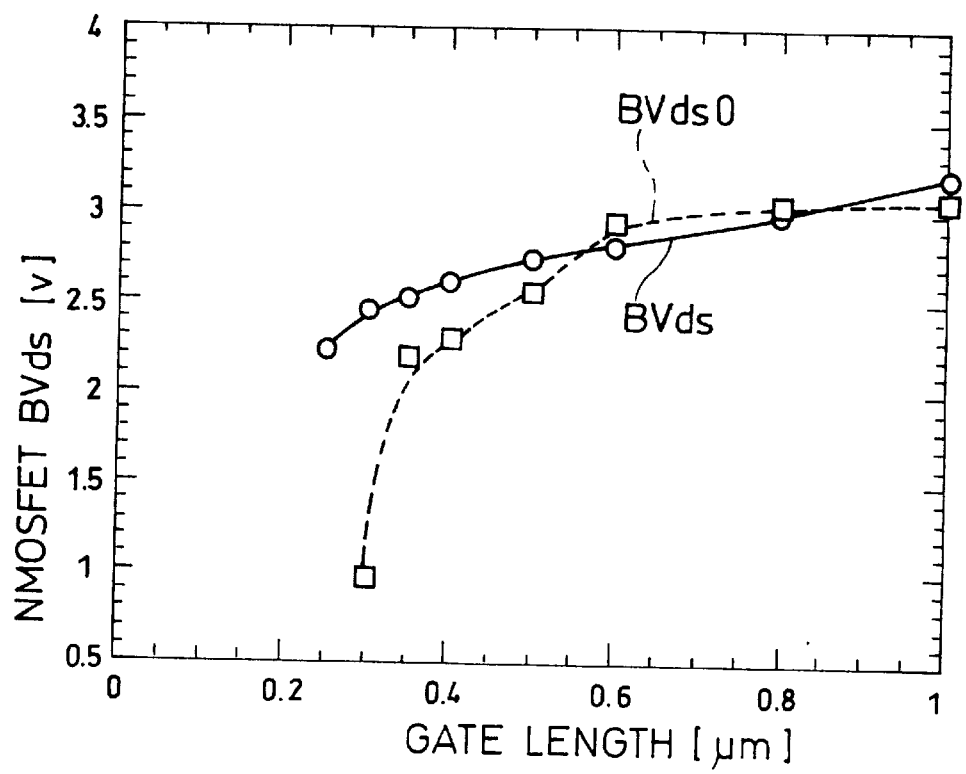
FIG. 7 is a graph showing the source-drain breakdown voltage characteristics versus the gate length in the NMOSFET.

For example, the source-drain breakdown voltage BVds decreases as the current gain $h_{fe}$ of the parasitic transistor T2 increases as shown by equation (2) above. In the FET 1 of this embodiment, the current gain $h_{fe}$ of the parasitic transistor T2 is reduced. Therefore, as shown in FIG. 7, compared to the conventional structure, the breakdown voltage BVds is not readily lowered even when the gate length of the FET 1 becomes shorter. In FIG. 7, the state in which the doping profile in the channel region 5 is constant is indicated as a conventional breakdown voltage BVds0 like FIG. 6. As is clear from FIG. 7, for example, when the gate length is approximately 0.3 $\mu$m, the conventional breakdown voltage Bvds0 is about 1 V. On the other hand, the breakdown voltage of this embodiment is about 2.4 V, showing an increase of about 1.4 V.

Figure 8:
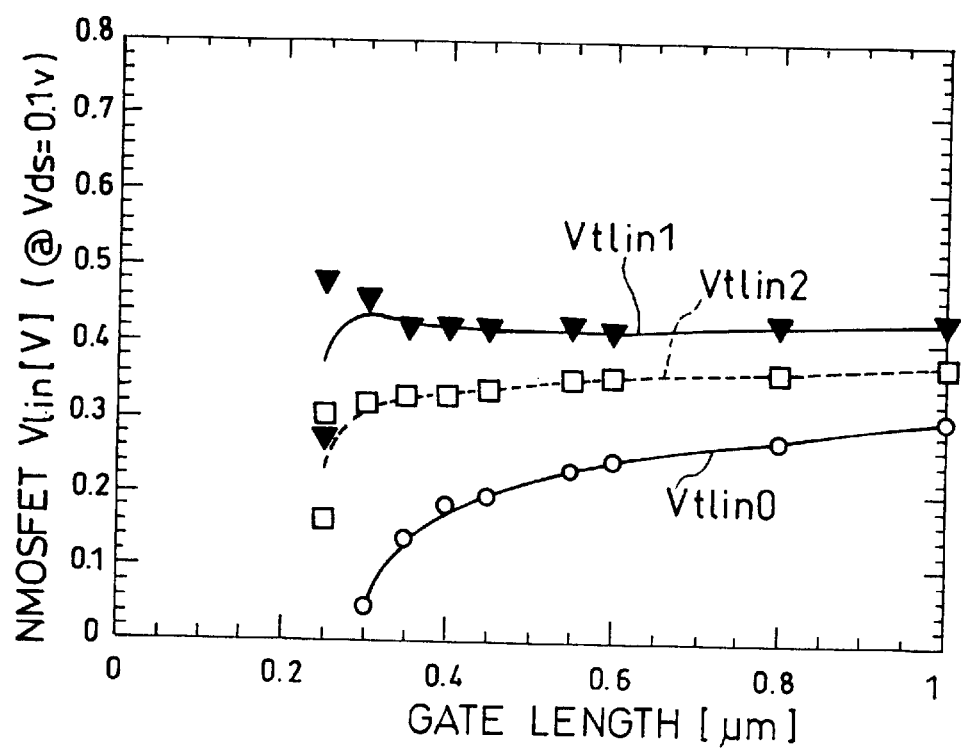
FIG. 8 is a graph showing the roll-off characteristics of the threshold voltage versus the gate length in the NMOSFET.

Moreover, as shown in FIG. 8, in the FET 1 of this embodiment, the roll-off characteristics Vtlin1 and Vtlin2 of the threshold voltage Vth are not much lowered until the gate length becomes about 0.3 $\mu$m or less, keeping a higher value compared to the conventional roll-off characteristic Vtlin0. In FIG. 8, an FET of a structure similar to those of FIGS. 6 and 7 is shown as a conventional example. In this case, the source-drain voltage Vds is 0.1 V. The Vtlin1 and Vtlin2 are the same except that the amount of dose in the channel region 5 varies.

Figure 9:
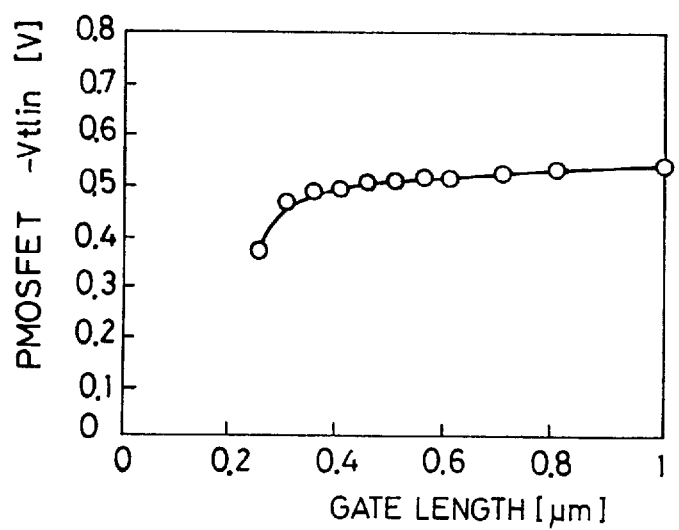
FIG. 9 is a graph showing the roll-off characteristics of the threshold voltage versus the gate length in a PMOSFET having the same structure as the NMOSFET.

FIG. 9 shows the roll-off characteristic Vtlin of the threshold voltage in a PMOSFET of a polarity opposite to that of the FET 1. In this case, like the NMOSFET, the roll-off characteristic Vtlin is not much lowered until the gate length becomes 0.3 $\mu$m or less. Since this FET has the same structure as the one mentioned above except that the polarity is opposite, the structure is not explained here.

As shown in FIGS. 8 and 9, the roll-off characteristic Vtlin of the threshold voltage Vth is not lowered until the channel length becomes 0.3 $\mu$m or less irrespectively of the polarity of the FET 1. Therefore, the FET 1 can be stably operated even when the channel length is in the order of sub-half-micron, for example, between 0.35 $\mu$m and 0.2 $\mu$m. The minimum gate length in a range in which a punch through does not occur is 0.27 $\mu$m. Therefore, even when a manufacturing device having a structure similar to that of the conventional example is used, it is possible to achieve a sufficient margin in manufacturing.

Referring now to FIGS. 10 to 16, the following description will discuss an example of the application of the FET of the above-mentioned structure, for example, a CMOS element including the NMOSFET and PMOSFET.

Figure 10:
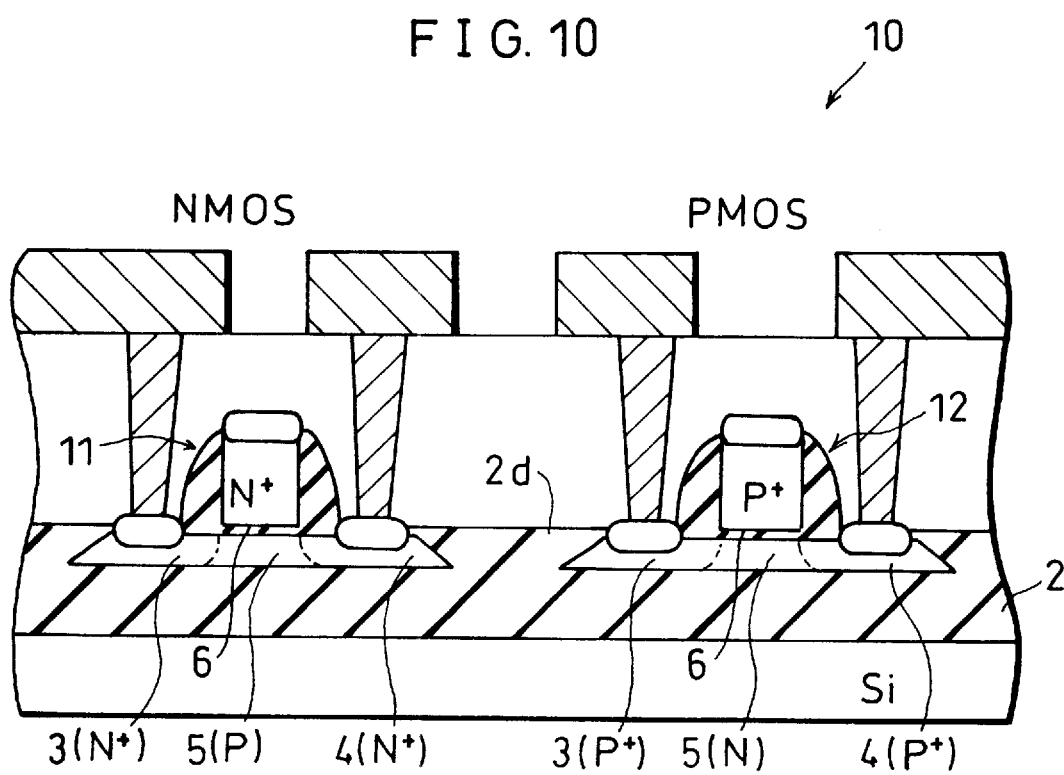
FIG. 10 is a cross sectional view showing the structure of essential sections of a CMOS element constituted by the PMOSFET and the NMOSFET.

As illustrated in FIG. 10, a CMOS element 10 includes an NMOSFET 11 and a PMOSFET 12 which is the same as the NMOSFET 11 except for the polarity. The FETs 11 and 12 are insulated from each other by an isolation region 2d formed in the SOI substrate 2, forming a CMOS structure. Since the structures of the FETs 11 and 12 are the same as the one shown in FIG. 1, the explanation thereof will be omitted. However, in the FETs 11 and 12, the surfaces of the source region 3, drain region 4 and gate electrode 6 are salicided, thereby reducing the resistance in those regions. The gate length of the gate electrode 6 is set, for example, to 0.35 $\mu$m.

Figure 11:
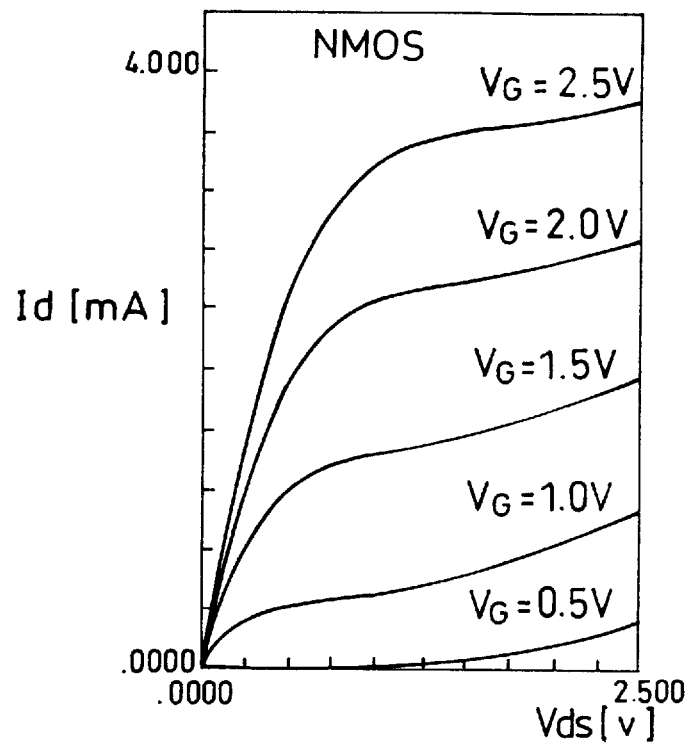
FIG. 11 is a graph showing drain current characteristics versus a source-drain voltage in the NMOSFET.
Figure 12:
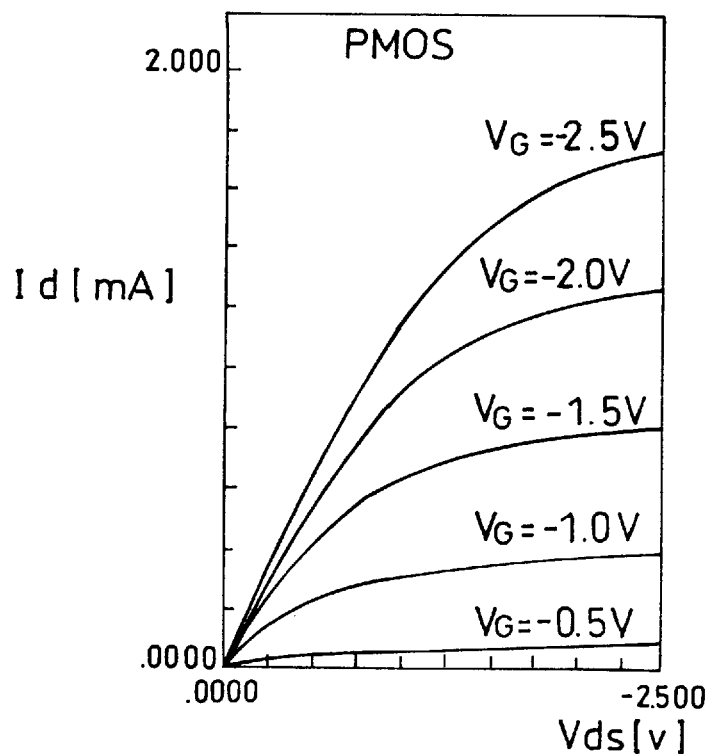
FIG. 12 is a graph showing drain current characteristics versus a source-drain voltage in the PMOSFET.

The characteristics of a drain current Id versus the source-drain voltage Vds when the gate voltage $V_G$ is varied in the FETs 11 and 12 are shown in FIG. 11 and 12. In this embodiment, since the channel region 5 of each of the FETs 11 and 12 can be fully depleted, the "kink" effect is not exhibited in this embodiment.

Figure 14:
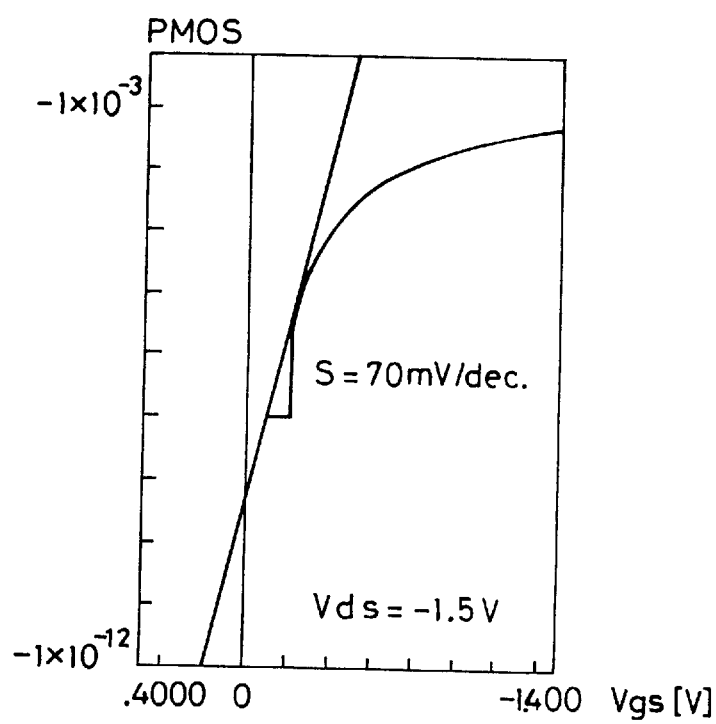
FIG. 14 is a graph showing sub-threshold characteristics in the PMOSFET.

FIGS. 13 and 14 show a sub-threshold Id-$V_{GS}$ characteristics of the FETs 11 and 12, respectively, when the source-drain voltage Vds is 1.5 V. As shown in FIGS. 13 and 14, the sub-threshold Id-$V_{GS}$ characteristic is 65 mV/dec in the NMOSFET 11, and the sub-threshold Id-$V_{GS}$ characteristic is 70 mV/dec in the PMOSFET 12. Namely, abrupt and good characteristics are obtained.

Furthermore, when each of $V_{GS}$ and Vds is 1.5 V, the drive current of the NMOSFET 11 is 150 $\mu$A/$\mu$m, and the drive current of the PMOSFET 12 is 70 $\mu$A/$\mu$m. When the NMOSFET 11 has the minimum gate length, the source-drain breakdown voltage BVds in the OFF state is 2.5 V if Id=0.1 $\mu$A/$\mu$m. Therefore, even if the FET 11 is used for a supply voltage of 1 V to 1.8 V in a typical low-voltage drive device, a breakdown does not occur.

Figure 15:
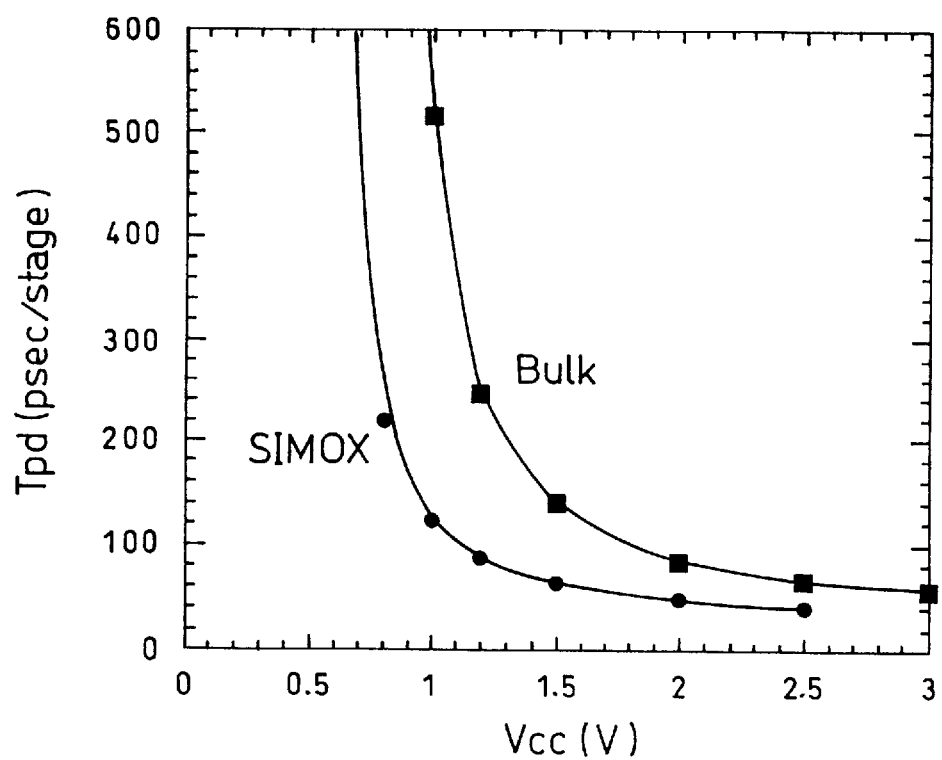
FIG. 15 is a graph showing the relationship between a power supply voltage and an inverter speed in the CMOS element.
Figure 16:
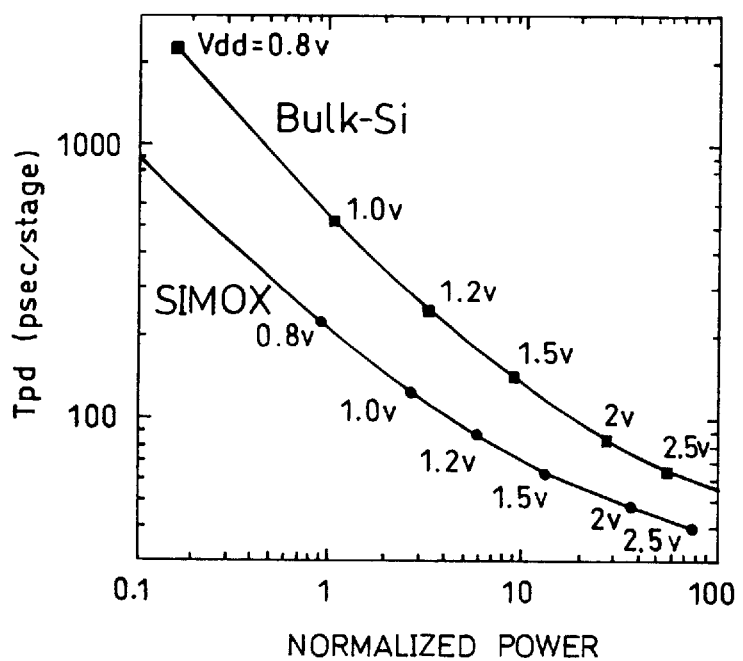
FIG. 16 is a graph showing the relationship between normalized power consumption and inverter speed in the CMOS element.

On the other hand, as shown in FIG. 15, in the CMOS element 10 having both of the FETs 11 and 12, the propagation delay is reduced compared to a conventional CMOS element (FO=1) fabricated on bulk silicon. More specifically, the propagation delay Tpd of the inverter of the bulk CMOS element is about 140 psec/stage, while the propagation delay Tpd of the inverter of the CMOS element 10 of this embodiment is shortened to about 65 psec/stage. Moreover, as shown in FIG. 16, when these CMOS elements are compared at the same speed, the power consumption of the CMOS element 10 of this embodiment is reduced to about one fifth of that of the conventional CMOS element on bulk silicon.

For example, high-performance electronic devices capable of being carried, such as a portable communication system, require high-speed low-power-consuming logical devices and PLL circuits of enhanced integration. When such a PLL circuit is constructed using the CMOS element 10, the PLL circuit is operated by a supply voltage of 2 V at a maximum frequency of, for example, 1.5 Ghz. When the maximum frequency is 1.1 Ghz, the PLL circuit is operated by a supply voltage of 1.5 V. Additionally, as described above, the channel length of both of the FETs 11 and 12 constituting the CMOS element 10 is shortened to the sub-half-micron order. Therefore, the use of the CMOS element 10 of this embodiment greatly contributes to the realization of high-performance low-power-consuming electronic devices. Examples of suitable use of the CMOS element 10 include a PLL synthesizer for a PHS (Personal Handy-phone System).

Next, the following description will discuss the process of fabricating the FET 1 of the above-mentioned structure with reference to FIGS. 17 to 21. The NMOSFET 1 shown in FIG. 1 will be explained as an example. However, the PMOSFET 12, and the CMOS element 10 formed by the NMOSFET and PMOSFET are basically manufactured in the same process.

Figure 17:
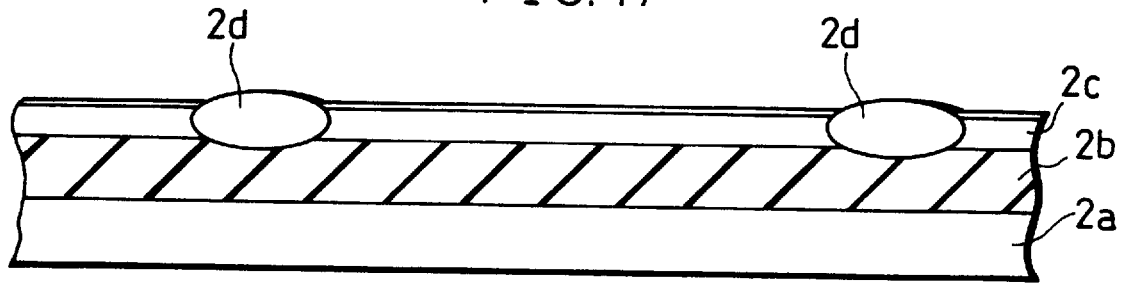
FIG. 17 is a cross sectional view of the SOI substrate before the formation of a gate electrode in the sequence of fabricating the NMOSFET.

As illustrated in FIG. 17, the SOI substrate 2 before fabricating the FET includes the substrate 2a made of an insulating material such as silicon sapphire, quartz and glass, the insulating film 2b layered thereon, and the semiconductor thin film 2c formed thereon. For example, the SOI substrate 2 may be a BSOI or SIMOX type substrate. The thickness of the semiconductor thin film 2c is adjusted according to the final MOSFET characteristics. In the case of a Fully Depleted (FD) transistor, the thickness of the semiconductor thin film 2c is about 30 to 100 nm.

The isolation regions 2d are formed by any conventional methods, for example, LOCOS. After LOCOS formation, the SOI-MOSFET channel regions are implanted with impurities. In the case of an NMOS transistor, the implantation is performed using boron ions. In this case, the implant is adjusted to approximately $1 \times 10^{16}/cm^3$ to $10 \times 10^{16}/cm^3$. Further, a final annealing is performed at approximately 900° C. to unify the doping level.

For example, in the SOI substrate 2 with 50 nm thick semiconductor thin film 2c, in order to adjust the threshold voltage to about 0.4 V, $^{49}BF_2$ ions are implanted at a rate of $1 \times 10^{12} cm^{-2}$ at 25 keV. In this case, the concentration of P-type impurities at the center of the channel region is approximately $1 \times 10^{17}/cm^3$.

Figure 18:
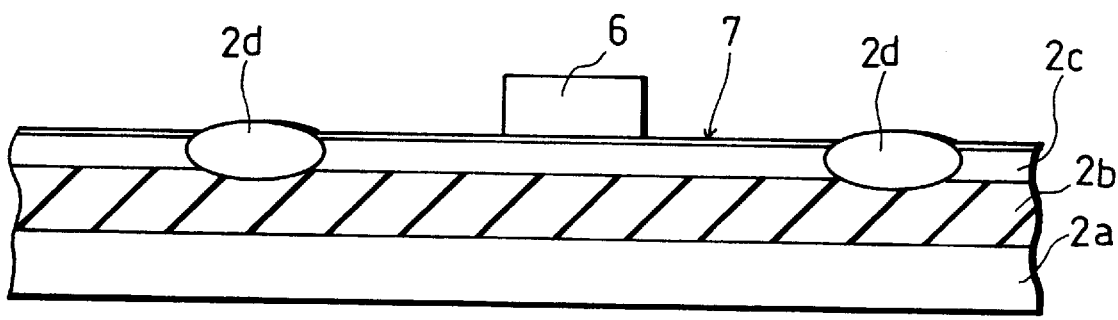
FIG. 18 is a cross sectional view showing the step of forming the gate electrode in the sequence of fabricating the NMOSFET.

Subsequently, as shown in FIG. 18, the gate oxide film 7 is deposited or grown on the surface of the substrate 2a. The final thickness of the gate oxide film 7 is around 5 to 9 nm for sub-half-micron channel length FETs.

After the gate oxide deposition, the gate electrode 6 is formed. In this example, a polycrystalline silicon film is formed on the gate oxide film 7, and then patterned to form a desired electrode pattern using conventional photolithography and etching techniques. In this embodiment, the gate electrode 6 is formed by polycrystalline silicon, but a refractory metal like $MoSi_2$ or $WSi_2$ can also be used.

Figure 19:
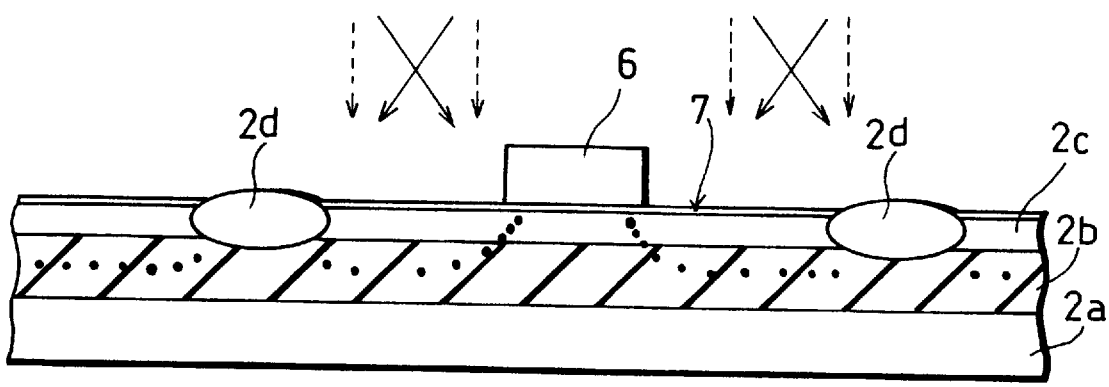
FIG. 19 is a cross sectional view showing the step of implanting impurities for adjusting the doping profile in the channel region in the sequence of fabricating the NMOSFET.

Next, as shown in FIG. 19, by using the gate electrode 6 as a mask, atoms with the same electrical polarity as the channel region are implanted into the SOI substrate 2 to form the laterally-graded channel doping profile. For an NMOS transistor, $^{11}B+$ is used. For an enhancement type PMOS transistor, $^{31}P+$ is implanted. In addition, as described above, the doping profile is determined so as to reduce the short-channel effects and suppress the influence of the parasitic transistor T2 shown in FIG. 5.

In order to implant the atoms underneath the gate electrode 6, this implantation is done at a tilted angle of 30 to 50 degrees with respect to a direction perpendicular to the surface of the SOI substrate 2, and the energy is adjusted to obtain an impurity concentration peak in the vicinity of the center of the semiconductor thin film 2c.

In the case of the semiconductor thin film 2c with a thickness of 50 nm and the polysilicon gate electrode 6 with a thickness of 200 nm, the $^{11}B+$ implantation energy is approximately 30 keV for the NMOSFET, and $^{31}P+$ are implanted at about 80 keV for the PMOSFET.

Alternatively, as shown in FIG. 19, a near zero tilt implantation can also be done, i.e., the ions can be implanted in a direction substantially perpendicular to the SOI substrate 2, to form the above-mentioned desired doping profile. In this case, the $^{11}B+$ implantation is performed at 15 keV for the NMOSFET, and the implantation is done using $^{31}P+$ at an energy of 40 keV for the PMOSFET.

The tilted angle of the ion implantation is determined according to a desired doping profile. More specifically, as the tilted angle becomes greater, the profile gradient in the channel region becomes moderate. The optimum tilted angle also depends on the implantation dose. For the semiconductor thin film 2c with a thickness of 50 nm, the best implantation dose is about $7 \times 10^{12}/cm^2$ to $10 \times 10^{12}/cm^2$.

Figure 23:
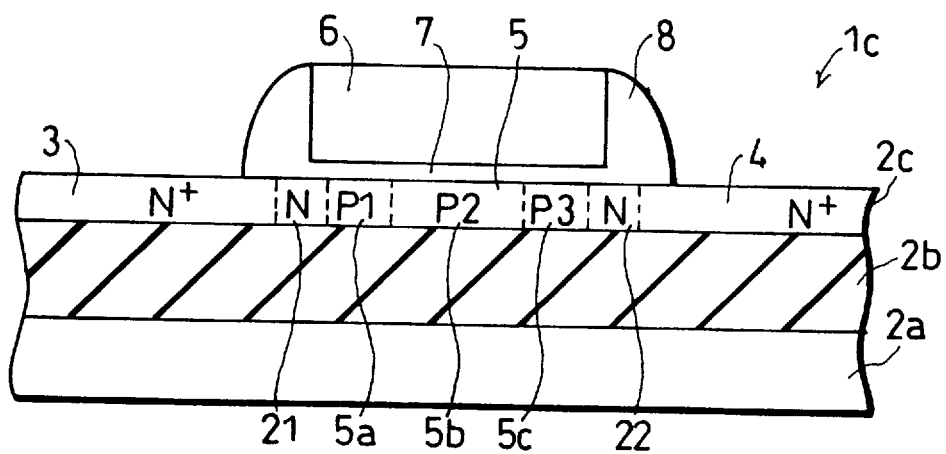
FIG. 23 is a cross sectional view showing essential sections of an another modified example of the NMOSFET.

As shown in FIG. 23, when an FET 1c includes LD sections 21 and 22 on both sides of the channel region 5 having a laterally-graded doping profile, impurities are implanted for the LD sections 21 and 22 at this stage (not shown) like the conventional example.

The implanted impurities are activated, and the doping profile gradient is further adjusted by drive-in annealing. As the annealing time becomes longer, the gradient coefficient, $\eta(\mu m^{-1})$ decreases and the doping profile gradient in the channel region becomes moderate. The annealing temperature and time in the drive-in annealing process are controlled to form a doping profile gradient that can minimize the current gain $h_{fe}$ of the parasitic transistor T2.

For example, drive-in annealing is performed at 850°C. for 60 minutes in the atmosphere of nitrogen to obtain an approximately gaussian profile (g=2) with $\eta$ of approximately $15/\mu m$ or $dN(x)/dx$ of approximately $5 \times 10^{22}/cm^4$.

Figure 20:
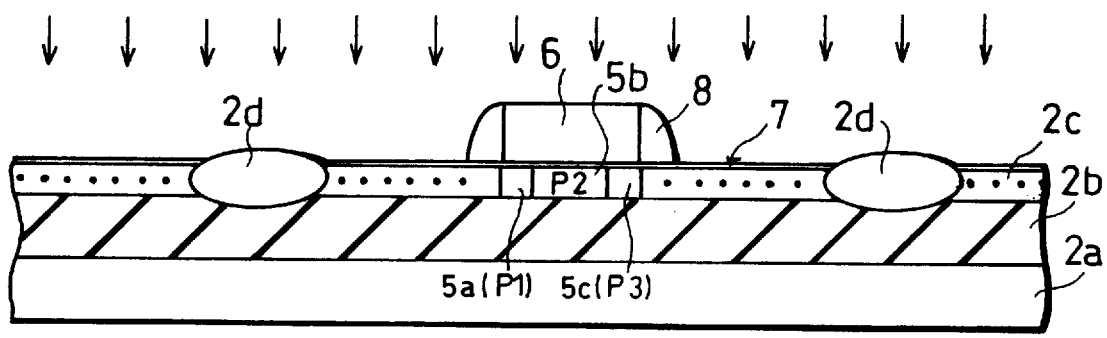
FIG. 20 is a cross sectional view showing the step of implanting impurities for forming source and drain regions in the sequence of fabricating the NMOSFET.

As a result, as shown in FIG. 20, the channel region 5 having three regions, 5a (P1), 5b (P2) and 5c (P3), and a desired doping profile is formed.

Moreover, the gate sidewall spacers 8 are formed on both sides of the gate electrode 6. The gate sidewall spacers 8 are formed in a conventional manner by depositing an oxide film by, for example, CVD oxidation and selectively removing the oxide film from undesired positions by anisotropic etch back.

Next, as shown by the solid arrows in FIG. 20, impurities are implanted to form the source and drain regions. N-type impurities are implanted for the NMOSFET, and P-type impurities are implanted for the PMOSFET. The implantation dose is about $4 \times 10^{15}/cm^2$.

Figure 21:
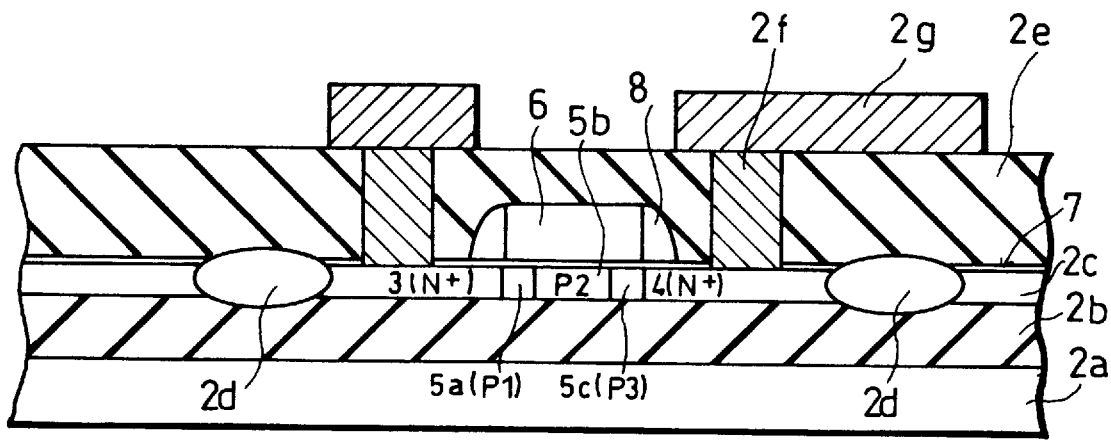
FIG. 21 is a cross sectional view of the completed NMOSFET in the sequence of fabricating the NMOSFET.

Thereafter, the implanted impurities are activated by performing, for example, rapid thermal annealing (RTA). As a result, the source region 3 and drain region 4 are formed as shown in FIG. 21.

Furthermore, an interlayer insulating layer 2e is formed on the semiconductor thin film 2c. Contact holes 2f running to the source region 3 and drain region 4 are formed in the interlayer insulating layer 2e. The metal wires 2g arranged on the interlayer insulating layer 2e are electrically connected to the source region 3 and drain region 4 through the contact holes 2f, respectively.

Through the processing steps shown in FIGS. 17 to 21, the FET 1 is fabricated on the SOI substrate 2. In this embodiment, the NMOS type has been explained as an example. However, basically, transistors of other structures like PMOS type, and CMOS type in which the NMOSFET and PMOSFET are connected, can be fabricated by the same process.

For instance, in the CMOS element 10 shown in FIG. 10, as an example of the design rules, the width and space of a silicon island are set to 0.40 $\mu m$ and 0.50 $\mu m$, respectively. The gate electrode length is set so that the width/space of the NMOSFET 11 and MOSFET 12 are 0.35 $\mu m$/0.45 $\mu m$, respectively. The size of the contact hole 2f is 0.40 $\mu m \times 0.40$ μm. The size of the via hole is 0.50 μm×0.50 μm. The thickness of the interlayer insulating layer 2e is about 1 μm.

In the fabrication process of the FET 1 of this embodiment, by appropriately controlling at least the conditions for the impurity ion implantation or the conditions for annealing, the doping profile in the channel region 5 is adjusted. Since other processing steps are the same as in the conventional example, it is possible to freely combine these steps with steps for forming silicided or double-gate structure.

As described above, the FET 1 of this embodiment includes the P-type channel region 5, and the N-type source and drain regions 3 and 4 disposed on both sides of the channel region 5 as shown in FIG. 1. All of the regions 3, 4 and 5 are formed in the semiconductor thin film 2c of the SOI substrate 2. In addition, the gate electrode 6 is disposed over the channel region 5 so as to cover the channel region 5 through the gate oxide film 7.

Moreover, the extreme regions 5a and 5c adjacent to the source region 3 and the drain region 4, and the center region 5b with a lower doping level than the extreme regions 5a and 5c are formed by changing the P-type doping level. The doping level in each of the extreme regions 5a and 5c is set so that the doping profile decreases substantially monotonically toward the center region 5b. The doping profile gradient is set so as to reduce the current gain $h_{fe}$ of the parasitic transistor T2 shown in FIG. 5. Furthermore, needless to say, the same arrangement can be made when the regions have opposite conductivity type.

Figure 29:
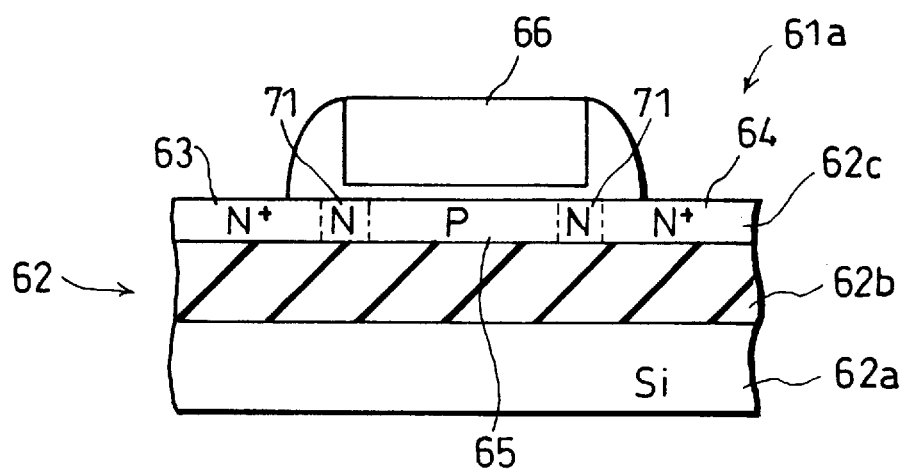
FIG. 29 is a cross sectional view showing the structure of essential sections of an MOSFET as a first conventional example.
Figure 30:
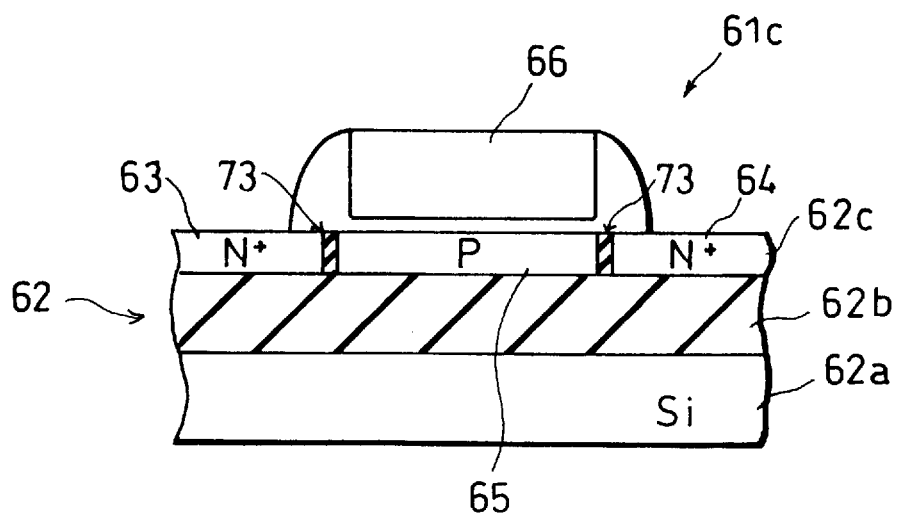
FIG. 30 is a cross sectional view showing the structure of essential sections of an MOSFET as a third conventional example.
Figure 31:
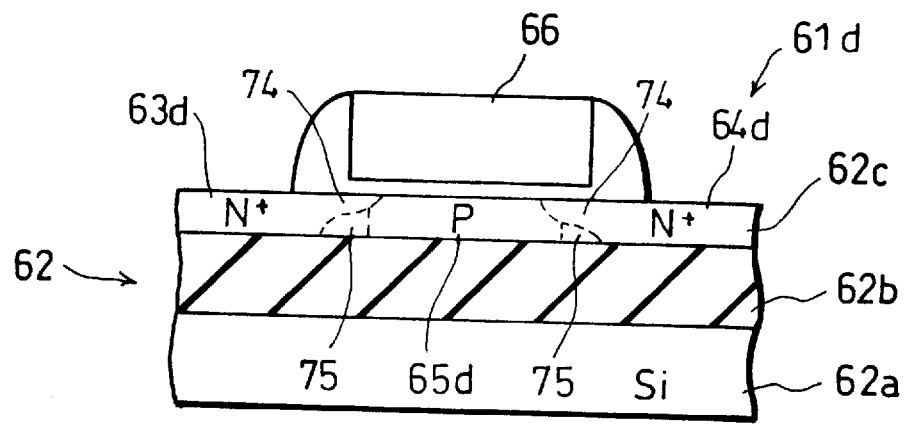
FIG. 31 is a cross sectional view showing the structure of essential sections of an MOSFET as a fourth conventional example.
Figure 32:
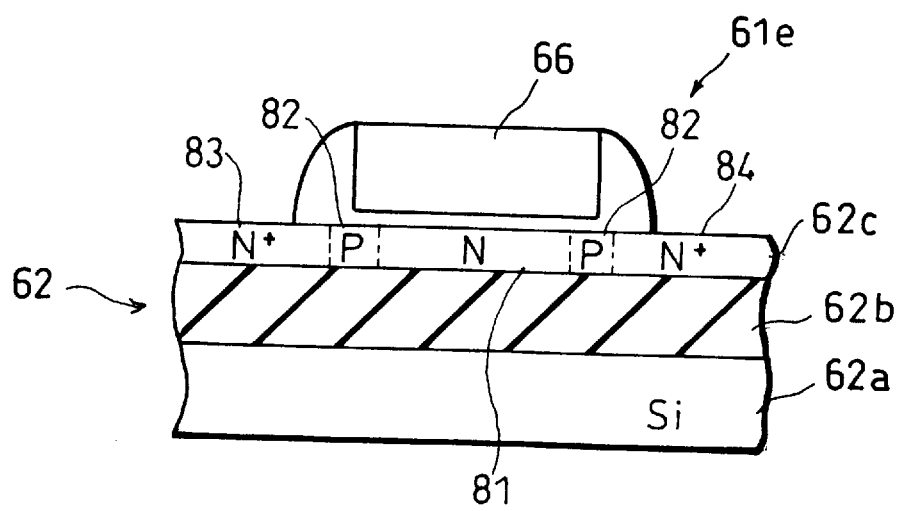
FIG. 32 is a cross sectional view showing the structure of essential sections of an MOSFET as a fifth conventional example.
Figure 33:
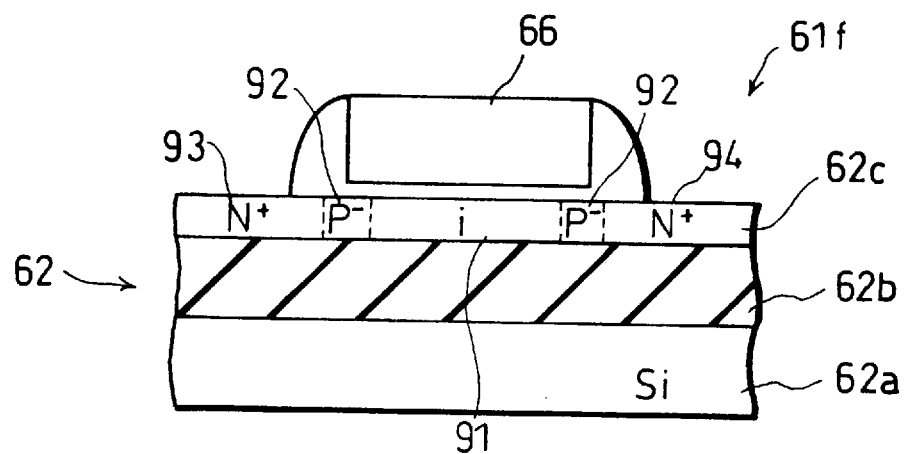
FIG. 33 is a cross sectional view showing the structure of essential sections of an MOSFET as a sixth conventional example.
Figure 34:
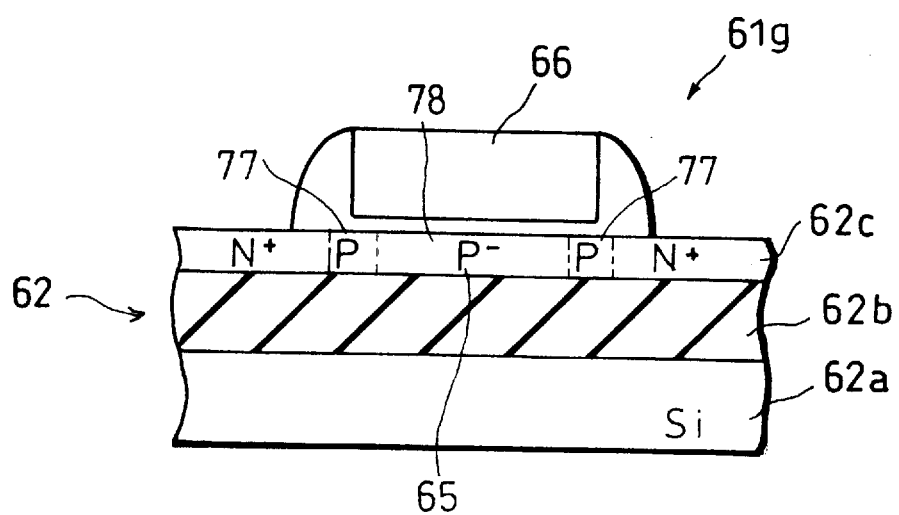
FIG. 34 is a cross sectional view showing the structure of essential sections of an MOSFET as a seventh conventional example.

In this structure, in the FET 1 that can be driven at low voltage and high speed and is fabricated on the SOI substrate 2 capable of easily improving the degree of integration, by adjusting the doping profile in the channel region 5, the current gain $h_{fe}$ of the parasitic transistor T2 is reduced without lowering the characteristics of the FET 1 such as the source-drain parasitic resistance. Accordingly, compared to the above-mentioned conventional examples which were not set up with the aim of improving the electrical characteristics (see FIG. 29), the occupance of the short-channel effects can be reduced. Consequently, even when the channel length decreases, the roll-off characteristic Vtlin of the threshold voltage Vth is not much lowered. In addition, since the current gain $h_{fe}$ of the parasitic transistor T2 is reduced, even when the channel length decreases, the lowering of the breakdown voltage BVds is small compared to that in the conventional structure. It is thus possible to provide the FET 1 that has improved electrical characteristics and is driven at lower voltage compared to the conventional structure.

Moreover, since the roll-off characteristic Vtlin of the threshold voltage Vth and the breakdown voltage BVds are kept at relatively high values even when the channel length is shortened to, for example, the sub-half-micron order, it is possible to stably operate the FET 1. Furthermore, since the FET 1 is operable with a further shortened channel length, a sufficient margin is obtained in manufacturing.

Additionally, in this embodiment, the doping profile in the channel region 5 is adjusted by the angle of implanting impurities into the channel region 5 or the drive-in annealing process for activating the impurities. Therefore, compared to the conventional manufacturing method, the FET 1 is manufactured by simply changing the ion implantation angle or the annealing time and temperature. Namely, it is possible to fabricate the FET 1 without requiring a new processing step, thereby simplifying the fabrication process.

The FET 1 of this embodiment is the same as the conventional transistor except for the structure of the channel region 5, and does not require a new member. Moreover, the above-mentioned profile has a predetermined gradient, and the doping level is gradually lowered from the extreme regions 5a and 5c toward the center region 5b. It is thus possible to use the diffusion of impurities during annealing to obtain a desired profile. Therefore, the influence of the diffusion of impurities on the FET 1 is reduced compared to the fifth and seventh conventional examples. Consequently, the structure of the FET 1 of this embodiment can be adopted even in a sub-half-micron channel length structure which is difficult to be applied to the first to seventh conventional examples. As a result, the degree of integration of the FET 1 is improved. Accordingly, the FET 1 of this embodiment greatly contributes to the fabrication of high-performance low-power-consuming electronic devices.

In the channel region 5, the lengths of the extreme regions 5a and 5c in a direction from the source side toward the drain side are preferably set so that the extreme regions 5a and 5c are fully depleted by the extension of the depletion layer from the source region 3 or drain region 4. As a result, unlike the seventh conventional example in which a region which is not partially depleted is present, the "kink" effect is not exhibited in the characteristics of the drain current Ids versus the source-drain voltage Vds in the FET 1 of this embodiment. Namely, the electrical characteristics of the FET 1 are further improved compared to the seventh conventional example.

When the profile of the doping level in the channel region 5 is given by an approximate value N(x) derived from equation (1), the gradient coefficient η for determining the profile is preferably within a range of from 8 and 20. In general, when adjusting the profile by oblique ion implantation or drive-in annealing, the adjustment can be easily made by setting the sharpness g in a range of from 1 to 10. By setting $\eta(\mu m^{-1})$ between 8 and 20 when g is in the above-mentioned range, it is possible to approximately minimize the current gain $h_{fe}$ of the parasitic transistor T2 with accuracy. Therefore, the electrical characteristics of the FET 1, such as drive voltage and operation speed, is further improved.

In particular, the profile sharpness g can be easily set to 2 when implanting the channel region 5 with boron as impurities. When the profile sharpness g is 2, i.e., when the profile is adjusted to be a gaussian profile, the current gain $h_{fe}$ can be approximately minimized by setting the doping profile gradient between $3 \times 10^{22}/cm^4$ and $8 \times 10^{22}/cm^4$.

There are various methods for forming a desired doping profile in channel region 5. Examples are controlling the ion implantation conditions when implanting the channel region 5 with impurities, and controlling the drive-in annealing process. The ion implantation conditions include the implantation energy, the amount of dose, and the tilted angle formed by a direction perpendicular to the surface of the SOI substrate 2 and the implantation direction. The drive-in annealing conditions are the annealing time, temperature, etc. When the above-mentioned doping profile is formed by either of the methods, the same effects as in this embodiment can be obtained.

However, it is more preferred to form the doping profile by controlling both of the ion implantation conditions and the drive-in annealing conditions. In this case, for example, the ion implantation direction is set so that the tilted angle between the ion implantation direction and a direction perpendicular to the surface of the SOI substrate 2 is between 30° and 50°.

When adjusting the profile by controlling only the drive-in annealing conditions without particularly controlling the ion implantation conditions, i.e., when the ion implantation is performed substantially perpendicularly to the surface of the SOI substrate 2 and then the profile is adjusted only by the diffusion of the impurities performed by annealing, a higher annealing temperature and a longer annealing time, or a delicate adjustment of the annealing temperature are required compared to the adjustment performed by controlling both of the conditions.

In contrast, when performing the adjustment by controlling both of the conditions, the restrictions in setting the ion implantation conditions and the drive-in annealing conditions are relatively relaxed, and the tilted angle for the ion implantation or the annealing time and temperature can be freely set. As a result, for example, it is possible to avoid annealing at high temperatures which deteriorate the quality of the FET 1. Accordingly, the quality of the FET 1 is further improved.

The ion implantation and the drive-in annealing are essential for implanting the channel region 5 with impurities and activating the impurities, and performed more widely than before. Therefore, even when the doping profile is adjusted by controlling the ion implantation conditions and drive-in annealing conditions, the number of processing steps in manufacturing the FETs is restrained to the same level as the case where no attempt is made to improve the quality. Consequently, the fabrication process of the FET 1 is simplified compared to the first to seventh conventional examples.

Figure 22:
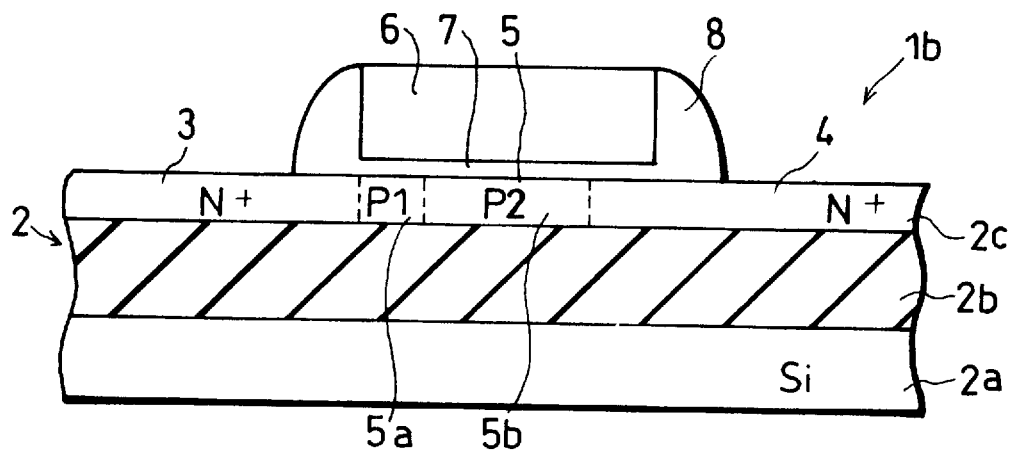
FIG. 22 is a cross sectional view showing essential sections of a modified example of the NMOSFET.

On the other hand, in the FET 1 of this embodiment, as shown in FIG. 1, the highly doped extreme regions 5a and 5c are provided adjacent to the source region 3 and drain region 4 on both sides of the channel region 5. However, this is merely an example, and an FET 1b may be constructed by forming the highly doped extreme region 5a only on a side of the channel region 5 adjacent to the source region 3 as shown in FIG. 22. In this case, in the channel region 5, the doping levels in the center region and the region adjacent to the drain region 4 are set at low levels like the center region 5b shown in FIG. 1.

In this modified example, like the FET 1 shown in FIG. 1, the current gain $h_{fe}$ of the parasitic transistor T2 is lowered. It is thus possible to exhibit substantially the same effects as the FET 1. However, in the FET 1b of this modified example, the highly doped region 5a is formed only on a side of the channel region 5 adjacent to the source region 3. Therefore, in a process like the process shown in FIG. 20, when implanting P-type impurities to determine the doping profile in the channel region 5, it is necessary to mask a side of the channel region 5 adjacent to the drain region 4 using, for example, a photoresist so as to prevent mixing of the impurities. Hence, a time consuming process is required for fabricating the FET 1b compared to the manufacture of the FET 1.

Namely, the highly doped extreme regions 5a and 5c are preferably formed adjacent to the source region 3 and drain region 4 on both sides of the channel region 5 like the FET 1 shown in FIG. 1. This structure requires a reduced number of time consuming tasks compared to the structure where the highly doped section 5a is formed only on a side of the channel region 5 adjacent to the source region 3.

Figure 24:
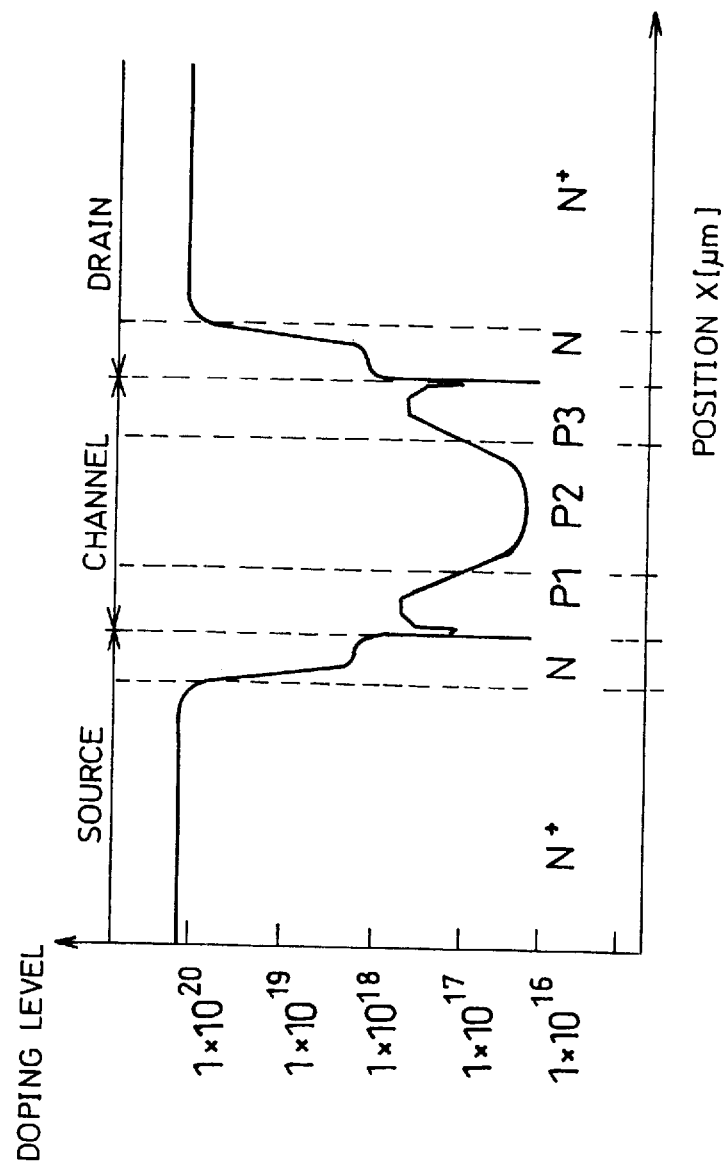
FIG. 24 is a graph showing an example of the doping profile in the NMOSFET.
Figure 25:
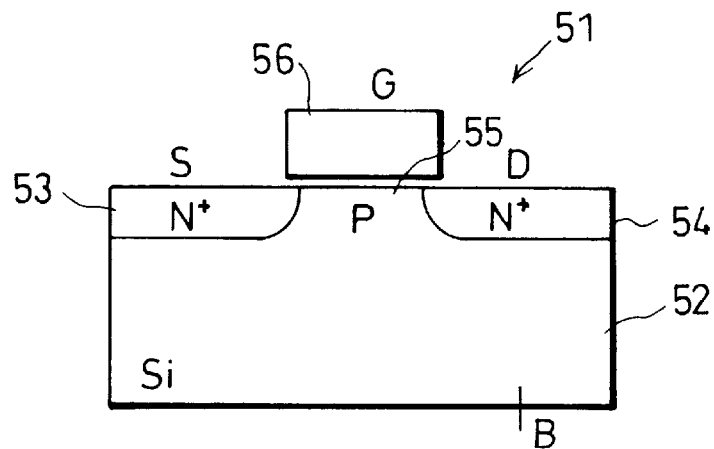
FIG. 25 is a cross sectional view showing essential sections of an MOSFET fabricated on a bulk silicon substrate as a conventional example.
Figure 26:
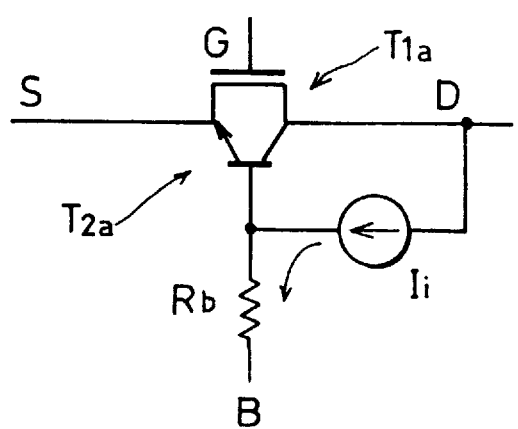
FIG. 26 is a circuit diagram showing an equivalent circuit of the MOSFET.
Figure 27:
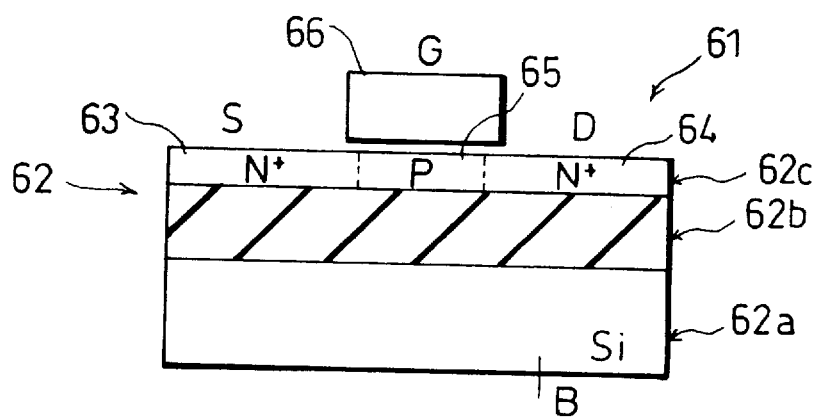
FIG. 27 is a cross sectional view showing essential sections of an MOSFET fabricated on an SOI substrate as another conventional example.
Figure 28:
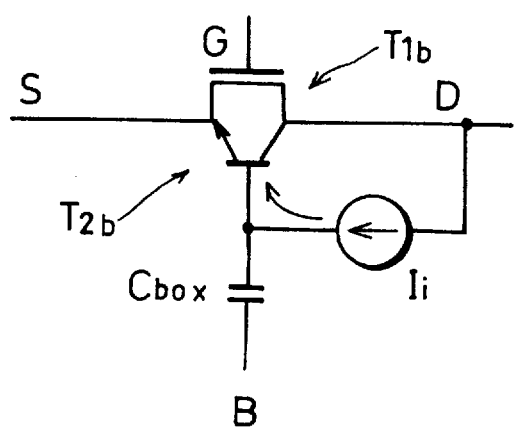
FIG. 28 is a circuit diagram showing an equivalent circuit of the MOSFET.

Moreover, like the FET 1c shown in FIG. 23, at portions of the source region 3 and drain region 4 adjacent to the highly-doped extreme regions 5a and 5c, LD (lightly doped) sections 21 and 22 with lower concentrations of N-type impurities compared to the remaining portions may be provided. In this case, as shown in FIG. 24, flat portions once appear at positions corresponding to the LD sections 21 and 22 in the doping profile for the FET 1c. Thus, the depletion layer readily spreads between the drain region 4 and the channel region 5. As a result, the electric field becomes moderate, and the breakdown voltage BVds of the FET 1c is increased.

In this case, however, an additional step of implanting impurities is required to form the LD sections 21 and 22. Moreover, since the source-drain parasitic resistance is increased, the power consumption during operation may increase. Therefore, it is necessary to select either of the structure of the FET 1 or the structure of the FET 1c according to desired FET characteristics. In the case where only a side of the channel region 5 adjacent to the source region 3 is heavily doped as shown in FIG. 22, it is possible to form only the LD section 21, or both of the LD sections 21 and 22. However, the formation of the LD sections 21 and 22 adjacent to the source region 3 and drain region 4 on both sides of the channel region 5 eliminates the necessity of masking when implanting impurities, resulting in a simplified fabrication process.

Needless to say, it is possible to manufacture a PMOSFET by using the structures of the FET 1b and FET 1c explained as modified examples. Furthermore, the CMOS element may be constructed using the PMOSFET and NMOSFET. In this case, the substantially same effect as the CMOS element 10 shown in FIG. 10 is exhibited.

The above-mentioned FETs 1, 1b and 1c can be used in a variety of fields because of their low threshold values and higher integration capabilities. A suitable example of such application is a CMOS element achieved by connecting the NMOSFET 11 and PMOS transistor 12 with the CMOS structure. In general, since the CMOS element is widely used for circuits which are expected to satisfy requirements such as low power consumption, high speed operation, and high integration like PLL circuits, the effects produced by the use of the structures of the FETs 1, 1b and 1c are significant. Consequently, a high-performance, high-speed, low-power-consuming electronic circuit can be achieved.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A field effect transistor comprising:
   a channel region of a first conductivity type formed in a superficial semiconductor layer overlying an electrically insulating substrate;
   a source region and a drain region of a second conductivity type different from said first conductivity type, said source and drain regions being disposed with said channel region therebetween;
   a highly doped portion provided in said channel region at least in a section adjacent to said source region, said highly doped portion having a doping profile N(x) formed so that a concentration of impurities of said first conductivity type is substantially monotonically lowered toward a center portion of said channel region; and
   a gate electrode insulated from said channel region by an electrically insulating layer,
   wherein said doping profile N(x) substantially conforms to the expression:

$$N(x) = N_0 + N_{B0} \cdot \exp[-(\eta \cdot x)^g)]$$

where $N_0$ is a minimum doping level, $N_{B0}$ is a maximum doping level, x is a displacement in $\mu$m from said highly doped portion toward said center portion of said channel region, g is a doping profile sharpness, and η is a doping profile gradient coefficient.

2. The field effect transistor according to claim 1, wherein said doping profile provides a parasitic transistor current gain of said field effect transistor that is less than a parasitic transistor current gain provided by a uniform doping profile.

3. The field effect transistor according to claim 1, wherein said doping profile is set so that said channel region is fully depleted when forming an inversion layer.

4. The field effect transistor according to claim 3, wherein a thickness of said superficial semiconductor layer is between 30 nm and 100 nm.

5. The field effect transistor according to claim 1, wherein when said doping profile gradient coefficient, η is between 8 and 20 $\eta \mu m^{-1}$.

6. The field effect transistor according to claim 1, wherein said sharpness g is 1, and said gradient coefficient η is between 16 $\mu m^{-1}$ and 18 $\mu m^{-1}$.

7. The field effect transistor according to claim 1, wherein said sharpness g is between 4 and 8, and said gradient coefficient η is between 8 $\mu m^{-1}$ and 15 $\mu m^{-1}$.

8. The field effect transistor according to claim 1, wherein said doping profile forms a gaussian profile, and
a gradient of said doping profile of said first conductivity type from said highly doped portion toward said center portion of said channel region is between $3 \times 10^{22}/cm^4$ and $8 \times 10^{22}/cm^4$.

9. The field effect transistor according to claim 8, wherein said impurities of said first conductivity type are boron.

10. The field effect transistor according to claim 1, wherein said highly doped portion is provided in said channel region on both sides thereof, and adjacent to said source region and said drain region.

11. The field effect transistor according to claim 1, wherein at least one of said source and drain regions adjacent to said highly doped portion includes:
a first region adjacent to said highly doped portion; and
a second region in which a doping level of impurities of said second conductivity type is higher than in said first region.

12. The field effect transistor according to claim 1, wherein at least a part of said source and drain regions and said gate electrode is salicided.

13. A complementary metal oxide semiconductor element with a complementary metal oxide semiconductor structure comprising:
a first field effect transistor which is a field effect transistor defined in claim 1, wherein said first conductivity type is N type; and
a second field effect transistor which is a field effect transistor defined in claim 1, wherein said first conductivity type is P type.

14. The field effect transistor according to claim 1, wherein said doping profile sharpness g is 2, and said doping profile gradient coefficient η is around 15 ($\mu m^{-1}$).

15. A field effect comprising:
a channel region of a first conductivity type formed in a superficial semiconductor layer overlying an electrically insulating substrate;
a source region and a drain region of a second conductivity type different from said first conductivity type, said source and drain regions being disposed with said channel region therebetween;
a highly doped portion provided in said channel region at sections adjacent to said source and drain regions, said highly doped portion having a doping profile N(x) formed so that a concentration of impurities of said first conductivity type is substantially monotonically lowered toward a center portion of said channel region; and
a gate electrode insulated from said channel region by an electrically insulating layer,
wherein said doping profile N(x) substantially conforms to the expression:

$$N(x) = N_0 + N_{B0} \cdot \{\exp(-[\eta \cdot (x-L/2)]^g) + \exp(-[\eta \cdot (x+L/2)]^g)\}$$

where $N_0$ is a minimum doping level, $N_{B0}$ is a maximum doping level, L is a length in $\mu m$ of said channel region, x is a displacement in $\mu m$ from said center portion of said channel region toward said highly doped portion, g is a doping profile sharpness, and η is a doping profile gradient coefficient.

16. The field effect transistor according to claim 15, wherein said doping profile gradient coefficient η is set between 8 $\mu m^{-1}$ and 20 $\mu m^{-1}$.

17. The field effect transistor according to claim 15, wherein said doping profile is set so that said channel region is fully depleted when forming an inversion layer.

18. The field effect transistor according to claim 17, wherein a thickness of said superficial semiconductor layer is between 30 nm and 100 nm.

19. The field effect transistor according to claim 15, wherein said sharpness g is 1, and said gradient coefficient η is between 16 $\mu m^{-1}$ and 18 $\mu m^{-1}$.

20. The field effect transistor according to claim 15, wherein said sharpness g is between 4 and 8, and said gradient coefficient η is between 8 $\mu m^{-1}$ and 15 $\mu m^{-1}$.

21. The field effect transistor according to claim 15, wherein said doping profile sharpness g is 2, and said doping profile gradient coefficient η is approximately 15 $\mu m^{-1}$.

22. The field effect transistor according to claim 21, wherein said impurities of said first conductivity type are boron.

23. The field effect transistor according to claim 15, wherein at least one of said source and drain regions adjacent to said highly doped portion includes:
a first region adjacent to said highly doped portion; and
a second region in which a doping level of impurities of said second conductivity type is higher than in said first region.

24. The field effect transistor according to claim 15, wherein at least a part of said source and drain regions and said gate electrode is salicided.

25. A complementary metal oxide semiconductor element with a complementary metal oxide semiconductor structure comprising:
a first field effect transistor which is a field effect transistor as defined in claim 15, wherein said first conductivity type is N type; and
a second field effect transistor which is a field effect transistor as defined in claim 15, wherein said first conductivity type is P type.

* * * * *